(12) United States Patent
Jin et al.

(10) Patent No.: US 11,881,497 B2
(45) Date of Patent: Jan. 23, 2024

(54) IMAGE SENSOR AND IMAGE SENSING CIRCUIT

(71) Applicant: SAMSUNG ELECTRONICS CO., LTD., Suwon-si (KR)

(72) Inventors: Young Gu Jin, Osan-si (KR); Young Chan Kim, Seongnam-si (KR)

(73) Assignee: Samsung Electronics Co., Ltd.

( * ) Notice: Subject to any disclaimer, the term of this patent is extended or adjusted under 35 U.S.C. 154(b) by 158 days.

(21) Appl. No.: 17/409,842

(22) Filed: Aug. 24, 2021

(65) Prior Publication Data

US 2022/0199672 A1    Jun. 23, 2022

(30) Foreign Application Priority Data

Dec. 18, 2020   (KR) .................. 10-2020-0177944

(51) Int. Cl.
*H01L 27/146* (2006.01)
*H04N 25/75* (2023.01)
*H04N 25/77* (2023.01)

(52) U.S. Cl.
CPC .. *H01L 27/14643* (2013.01); *H01L 27/14636* (2013.01); *H04N 25/75* (2023.01); *H04N 25/77* (2023.01)

(58) Field of Classification Search
CPC ...... H04N 25/75; H04N 25/77; H04N 25/771; H04N 25/59; H04N 25/76; H01L 27/14643; H01L 27/14636; H01L 27/14656; H01L 27/14612; H01L 27/1463; H01L 27/14638; H01L 27/14603; H01L 27/14605
See application file for complete search history.

(56) References Cited

U.S. PATENT DOCUMENTS

| | | | |
|---|---|---|---|
| 8,710,419 B2 | 4/2014 | Bogaerts | |
| 10,154,210 B2 | 12/2018 | Geurts et al. | |
| 10,756,129 B2 | 8/2020 | Geurts | |
| 2007/0007611 A1* | 1/2007 | Park | H01L 27/14609 257/431 |
| 2007/0034965 A1* | 2/2007 | Jung | H01L 27/14603 257/369 |
| 2008/0157152 A1* | 7/2008 | Shim | H01L 27/14609 257/292 |
| 2008/0237446 A1 | 10/2008 | Oshikubo et al. | |
| 2009/0244514 A1* | 10/2009 | Jin | G01C 3/08 356/4.01 |

(Continued)

*Primary Examiner* — Lin Ye
*Assistant Examiner* — John H Morehead, III
(74) *Attorney, Agent, or Firm* — Fish & Richardson P.C.

(57) ABSTRACT

An image sensor, which stores electric charge overflowing from a photoelectric conversion layer, includes: (1) a substrate including a first surface and a second surface, which is opposite to the first surface and upon which light is incident, (2) a photoelectric conversion layer in the substrate, (3) an isolation film disposed on the substrate, along the photoelectric conversion layer, (4) a storage conductive pattern disposed in the isolation film, (5) a transfer gate disposed on a first surface of the substrate, (6) a first impurity-injected area disposed between the photoelectric conversion layer and the isolation film, and (7) a second impurity-injected area disposed on the first surface of the substrate and connected to the transfer gate. The first and second impurity-injected areas are electrically connected.

20 Claims, 37 Drawing Sheets

(56) References Cited

U.S. PATENT DOCUMENTS

| | | | |
|---|---|---|---|
| 2009/0284731 A1* | 11/2009 | Jin | H01L 27/14609 |
| | | | 356/4.01 |
| 2011/0019045 A1 | 1/2011 | Lin | |
| 2013/0320407 A1* | 12/2013 | Ahn | H01L 31/02 |
| | | | 257/239 |
| 2014/0103413 A1* | 4/2014 | Jin | H04N 25/767 |
| | | | 257/292 |
| 2014/0104942 A1* | 4/2014 | Jin | H01L 27/14614 |
| | | | 365/183 |
| 2014/0263947 A1 | 9/2014 | Dierickx | |
| 2016/0204150 A1* | 7/2016 | Oh | H01L 27/14609 |
| | | | 257/229 |
| 2017/0200759 A1* | 7/2017 | Ihara | H01L 27/14643 |
| 2018/0182794 A1* | 6/2018 | Go | H01L 27/14636 |
| 2018/0190694 A1* | 7/2018 | Ihara | H01L 27/1464 |
| 2018/0358393 A1* | 12/2018 | Sato | H01L 27/14687 |
| 2018/0366508 A1* | 12/2018 | Goto | H01L 27/1463 |
| 2019/0148427 A1* | 5/2019 | Lee | H01L 27/14607 |
| | | | 257/446 |
| 2019/0214421 A1* | 7/2019 | Kim | H01L 27/14621 |
| 2019/0260952 A1* | 8/2019 | Lee | G06V 40/19 |
| 2019/0267429 A1* | 8/2019 | Zhang | H01L 27/14636 |

* cited by examiner

IMAGE SENSOR AND IMAGE SENSING CIRCUIT

CROSS-REFERENCE TO RELATED APPLICATION

This application claims priority to Korean Patent Application No. 10-2020-0177944, filed on Dec. 18, 2020, and all the benefits accruing therefrom under 35 U.S.C. § 119, the disclosure of which is incorporated herein by reference in its entirety.

BACKGROUND

1. Field

The present disclosure relates to an image sensor and an image sensing circuit.

2. Description of the Related Art

An image sensing device is a type of semiconductor device that converts optical information into electrical signals. Examples of the image sensing device include a charge-coupled device (CCD) image sensing device and a complementary metal-oxide semiconductor (CMOS)-type image sensing device.

The CMOS-type image sensor may also be referred to as a CMOS image sensor (CIS). The CIS may include a plurality of pixels that are arranged two-dimensionally. Each of the pixels may include, for example, a photodiode. The photodiode converts incident light into an electrical signal.

Recently, in accordance with developments in the computer and communication industries, the demand for image sensors with improved performance has grown in various fields such as the fields of digital cameras, camcorders, smartphones, gaming devices, security cameras, medical micro cameras and robots.

SUMMARY

Embodiments of the present disclosure provide an image sensor which stores electric charge overflowing from a photoelectric conversion layer.

Embodiments of the present disclosure also provide an image sensor which reads out electric charge overflowing from a photoelectric conversion layer.

Embodiments of the present disclosure also provide an image sensing circuit which stores electric charge overflowing from a photoelectric conversion layer.

Embodiments of the present disclosure also provides an image sensing circuit which reads out electric charge overflowing from a photoelectric conversion layer.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment of the present disclosure, the image sensor comprises: (1) a substrate including a first surface and a second surface, which is opposite to the first surface and upon which light is incident, (2) a photoelectric conversion layer in the substrate, (3) an isolation film disposed on the substrate, along the photoelectric conversion layer, (4) a storage conductive pattern disposed in the isolation film, (5) a transfer gate disposed on a first surface of the substrate, (6) a first impurity-injected area disposed between the photoelectric conversion layer and the isolation film, and (7) a second impurity-injected area disposed on the first surface of the substrate and connected to the transfer gate. The first and second impurity-injected areas are electrically connected.

According to embodiments of the present disclosure, the image sensing circuit comprises a pixel generating an image signal and a read-out circuit connected to the pixel, The pixel includes a photoelectric conversion layer, configured to convert incident light into first and second electric charges that are different from each other, and a capacitor configured to receive the second electric charge from the photoelectric conversion layer and store the second electric charge. The read-out circuit includes: (1) a transfer transistor, which is disposed adjacent to the photoelectric conversion layer and configured to receive the first electric charge from the photoelectric conversion layer, and (2) a floating diffusion, which is connected to the transfer transistor and the capacitor and configured to receive the first and second electric charges.

According to embodiments of the present disclosure, the image sensor comprises: (1) a substrate including a first surface and a second surface, which is opposite to the first surface and upon which light is incident, (2) a photoelectric conversion layer in the substrate, (3) a capacitor in the substrate, the capacitor extending in a first direction along the photoelectric conversion layer, (4) a transfer gate disposed on the first surface of the substrate, (5) a first impurity-injected area disposed on the first surface of the substrate and connected to the transfer gate, and (6) a connecting structure disposed on the first surface of the substrate. The capacitor and the first impurity-injected area are connected by the connecting structure.

According to embodiments of the present disclosure, the image sensor comprises: (1) a substrate including a first surface and a second surface, which is opposite to the first surface and upon which light is incident, (2) a first photoelectric conversion layer disposed in the substrate, (3) a second photoelectric conversion layer disposed in the substrate to be spaced apart from the first photoelectric conversion layer, (4) a first transfer gate disposed on the first surface of the substrate and connected to the second photoelectric conversion layer, (5) a storage gate disposed in the substrate, around the second photoelectric conversion layer, (6) a first impurity-injected area disposed in the substrate, between the second photoelectric conversion layer and the storage gate, and (7) a second impurity-injected area disposed on the first surface of the substrate and connected to the first transfer gate. The first and second impurity-injected areas are electrically connected.

According to embodiments of the present disclosure, the image sensor comprises first and second pixels defined on a substrate, the first and second pixels being different, and a capacitor disposed in the substrate. The first pixel includes: (1) a first photoelectric conversion layer in the substrate, (2) a first transfer gate, which is disposed on the substrate, and (3) a first impurity-injected area, which is connected to the first transfer gate, on the substrate. The second pixel includes: (4) a second photoelectric conversion layer in the substrate, (5) a second transfer gate, which is disposed on the substrate, and (6) a second impurity-injected area, which is connected to the second transfer gate, on the substrate. The capacitor, the first impurity-injected area, and the second impurity-injected area are electrically connected.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

Embodiments of the present disclosure will hereinafter be described with reference to the accompanying drawings.

Figure 1:
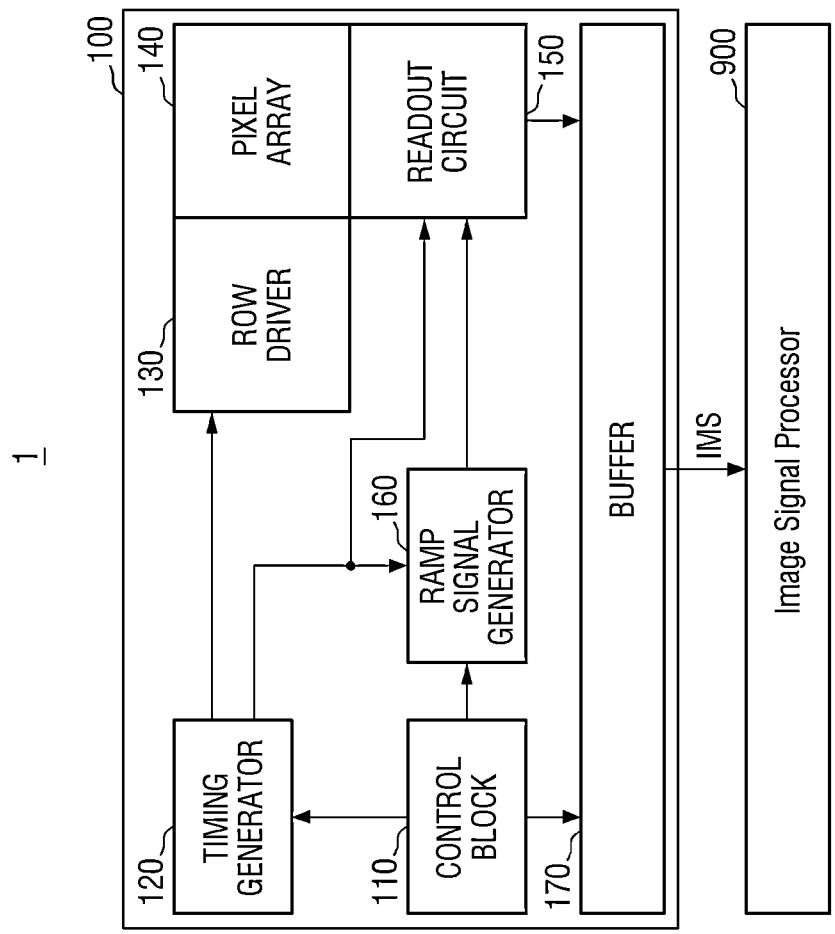
FIG. 1 is a block diagram of an image sensing device according to some embodiments of the present disclosure.

FIG. 1 is a block diagram of an image sensing device according to some embodiments of the present disclosure.

Referring to FIG. 1, an image sensing apparatus 1 may include an image sensor 100 and an image signal processor 900.

The image sensor 100 may generate an image signal IMS by sensing an image of a target object using light. In some embodiments, the image signal IMS may be, for example, a digital signal, but the present disclosure is not limited thereto.

The image signal IMS may be provided to, and processed by, the image signal processor 900. The image signal processor 900 may receive the image signal IMS from a buffer 170 of the image sensor 100 and may process the image signal IMS so that the image signal IMS may be suitable to be displayed.

In some embodiments, the image signal processor 900 may perform digital binning on the image signal IMS output from the image sensor 100. The image signal IMS output from the image sensor 100 may be a raw image signal from a pixel array 140 that is yet to be subject to analog binning or an image signal IMS that has already been subject to analog binning.

In some embodiments, the image sensor 100 and the image signal processor 900 may be separate. For example, the image sensor 100 may be mounted in a first chip, the image signal processor 900 may be mounted in a second chip, and the image sensor 100 and the image signal processor 900 may communicate with each other via a predetermined interface. However, the present disclosure is not limited to this example. Alternatively, the image sensor 100 and the image signal processor 900 may be incorporated into a single package, for example, a multichip package (MCP).

The image sensor 100 may include a control register block 110, a timing generator 120, a row driver 130, the pixel array 140, a readout circuit 150, a ramp signal generator 160, and the buffer 170.

The control register block 110 may generally control the operation of the image sensor 100. The control register block 110 may transmit operation signals directly to the timing generator 120, the ramp signal generator 160, and the buffer 170.

The timing generator 120 may generate an operation timing reference signal that can be referenced for the operation of various elements of the image sensor 100. The operation timing reference signal may be transmitted to the row driver 130, the readout circuit 150 and the ramp signal generator 160.

The ramp signal generator 160 may generate and transmit ramp signals for use in the readout circuit 150. For example, the readout circuit 150 may include a correlated double sampler (CDS) and a comparator and the ramp signal generator 160 may generate and transmit ramp signals for use in the CDS and the comparator.

The buffer 170 may include, for example, a latch. The buffer 170 may temporarily store the image signal IMS and may transmit the image signal IMS to an external memory or an external device.

The pixel array 140 may sense an external image. The pixel array 140 may include a plurality of pixels (or unit pixels). The row driver 130 may selectively activate each row of the pixel array 140.

The readout circuit 150 may sample a pixel signal provided from the pixel array 140, may compare the pixel signal with a ramp signal and may convert an analog image signal (or data) into a digital image signal (or data) based on the result of the comparison.

Figure 2:
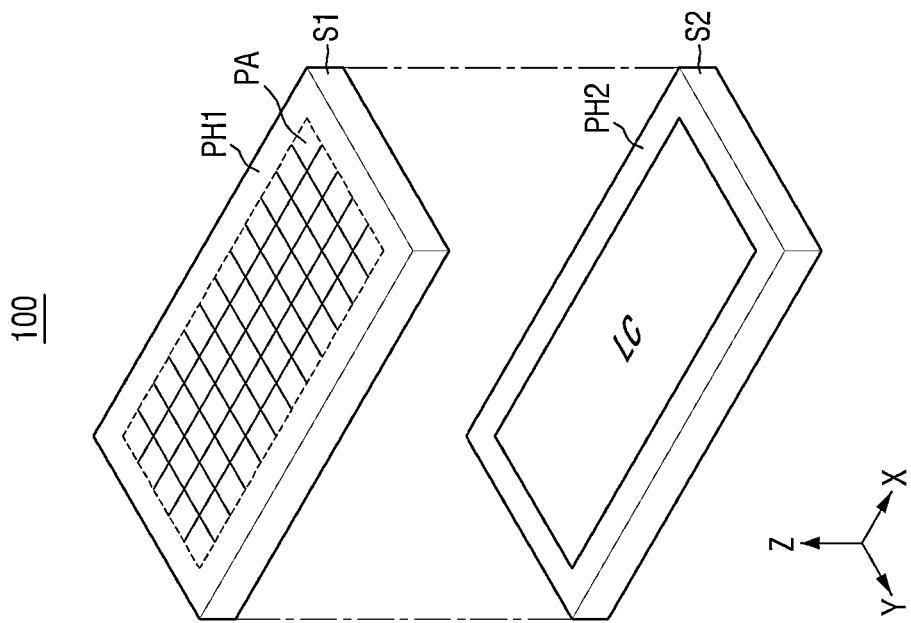
FIG. 2 is a circuit diagram illustrating the layout of the image sensor of FIG. 1.

FIG. 2 is a circuit diagram illustrating the layout of the image sensor of FIG. 1.

Referring to FIG. 2, the image sensor 100 may include first and second areas S1 and S2, which are stacked in a third direction Z. The first and second areas S1 and S2 may extend in first and second directions X and Y, as illustrated in FIG. 2, and the elements of the image sensor 100 may be disposed in the first and second areas S1 and S2.

Although not specifically illustrated, a third area where a memory is disposed may be provided below the second area S2. The memory may receive image data from the first and second areas S1 and S2, may store and process the image data, and may transmit the image data back to the first and second areas S1 and S2. The memory may include a memory element such as a dynamic random access memory (DRAM) element, a static random access memory (SRAM) element, a spin transfer torque-magnetic random access memory (STT-MRAM) element, or a flash memory element. In a case where the memory includes, for example, a DRAM element, the memory may receive and process image data at a relatively high speed. Also, in some embodiments, the memory may be disposed in the second area S2.

The first area S1 may include a pixel array area PA and a first peripheral area PH1, and the second area S2 may include a logic circuit area LC and a second peripheral area PH2. The first and second areas S1 and S2 may be sequentially stacked vertically.

In the first area S1, the pixel array area PA may be a region in which the pixel array 140 of FIG. 1 is disposed. The pixel array area PA may include a plurality of unit pixels that are arranged in a matrix. Each of the unit pixels may include a photodiode and transistors, and this will be described later.

The first peripheral area PH1 may include a plurality of pads and may be disposed near the pixel array area PA. The pads may transmit electrical signals to, or receive electrical signals from, an external device.

In the second area S2, the logic circuit area LC may include electronic elements that include a plurality of transistors. The electronic elements may be electrically connected to the pixel array area PA. The electronic elements may provide signals to each of the unit pixels of the pixel array area PA or may control output signals.

For example, the control register block 110, the timing generator 120, the row driver 130, the read-out circuit 150, the ramp signal generator 160, and the buffer 170 of FIG. 1 may be disposed in the logic circuit area LC. For example, all the elements of the image sensor 100, except for the pixel array 140, may be disposed in the logic circuit area LC.

The second peripheral area PH2, which corresponds to the first peripheral area PH1 of the first area S1, may be disposed in the second area S2, but the present disclosure is not limited thereto.

Figure 3:
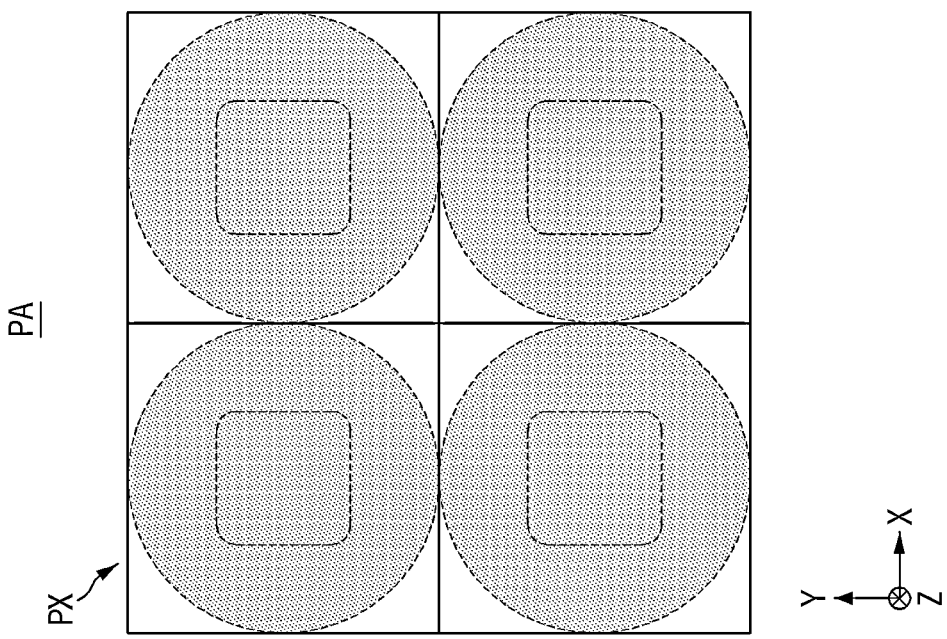
FIG. 3 illustrates a pixel array area of an image sensor according to some embodiments of the present disclosure.

FIG. 3 illustrates a pixel array area of an image sensor according to some embodiments of the present disclosure.

Figure 4:
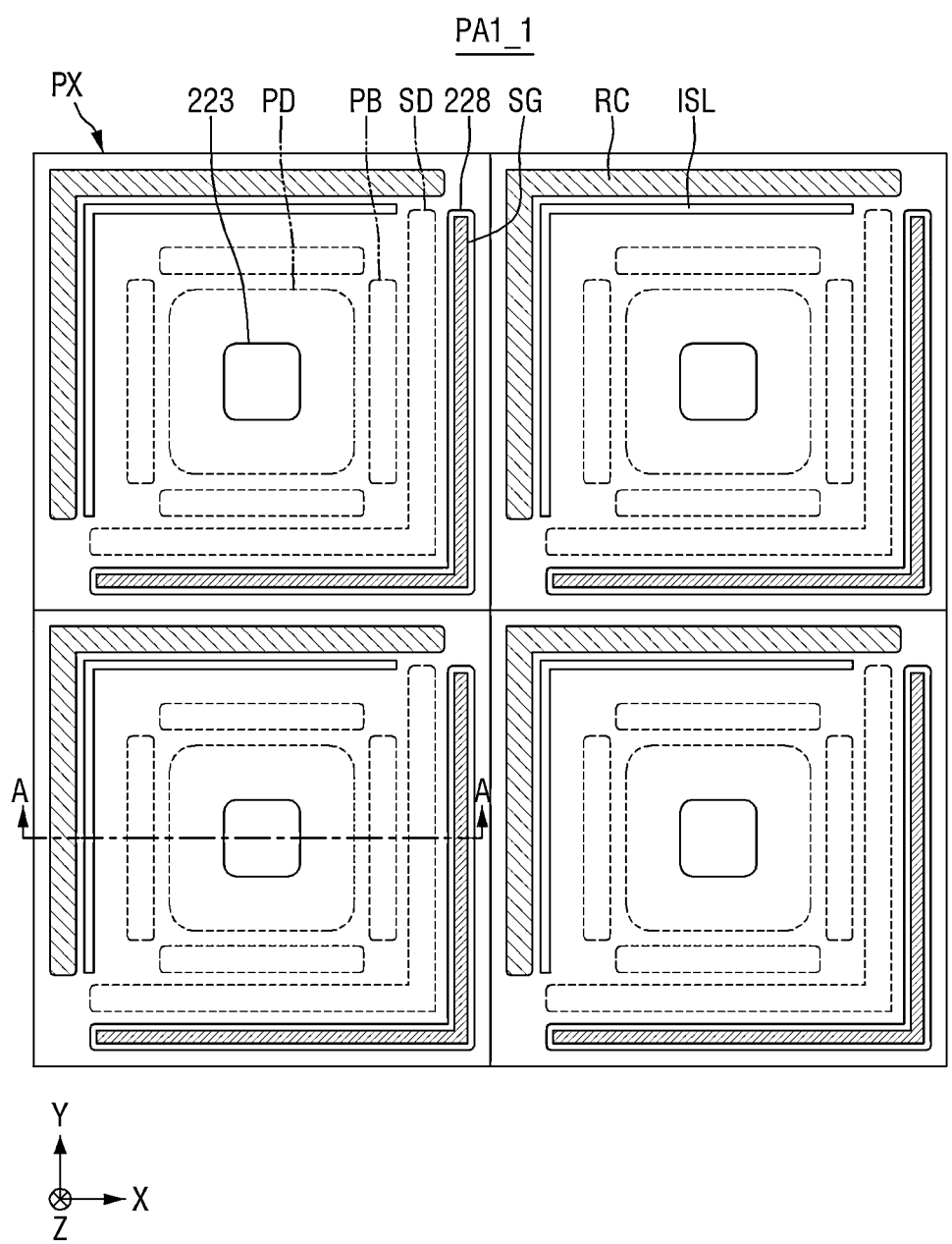
FIG. 4 is a layout view of a pixel array area according to some embodiments of the present disclosure.
Figure 5:
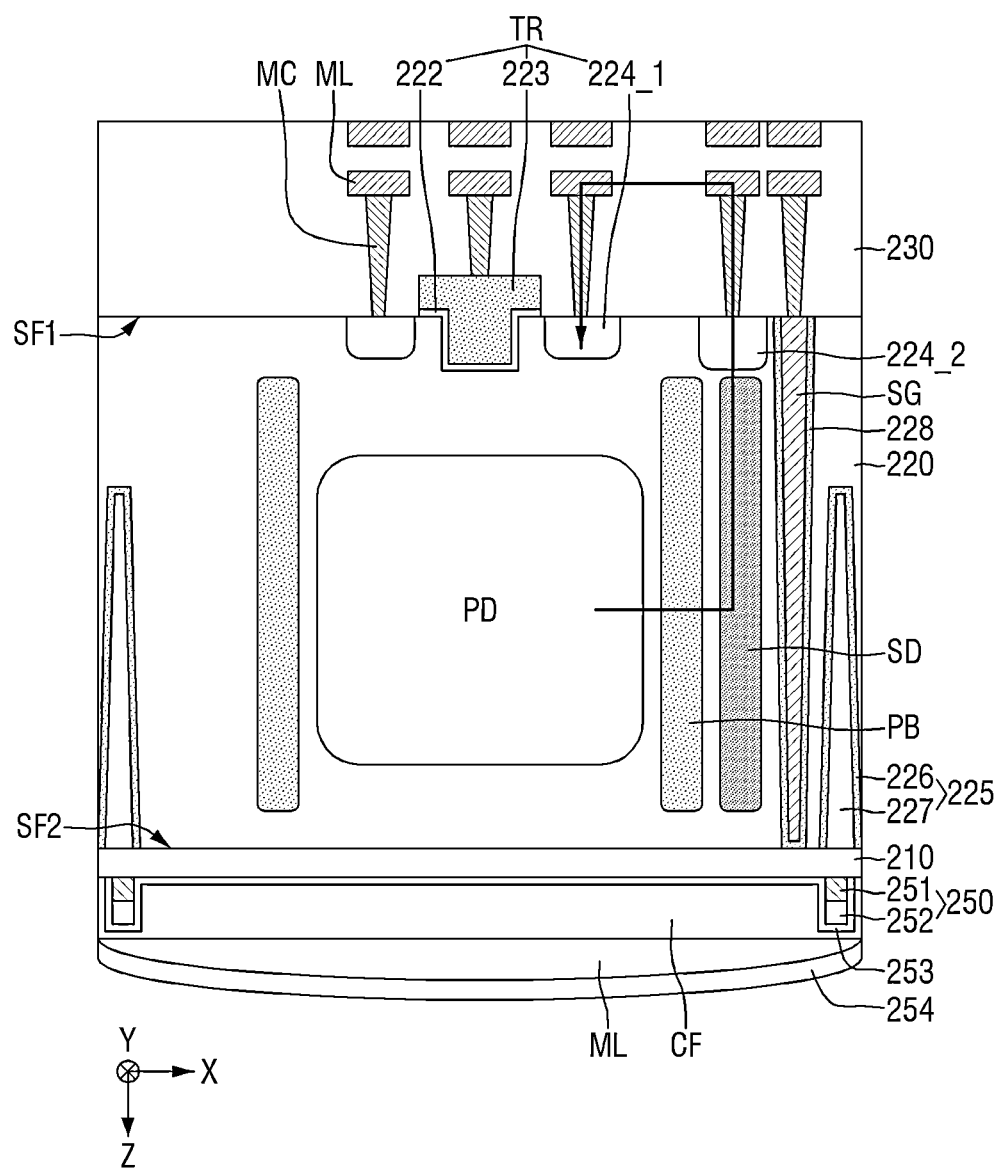
FIG. 5 is a cross-sectional view taken along line A-A of FIG. 4.

FIG. 4 is a layout view of a pixel array area according to some embodiments of the present disclosure. FIG. 5 is a cross-sectional view taken along line A-A of FIG. 4.

Referring to FIG. 3, the pixel array area PA may include a plurality of pixels PX. Here, the pixel array area PA may be included in the image sensor 100. For example, the pixel array area PA may be the pixel array area PA of FIG. 2 or the pixel array 140 of FIG. 1. Also, the pixels PX may be the unit pixels included in the pixel array area PA. For example, the pixels PX may be arranged at regular intervals in the first and second directions X and Y. However, the present disclosure is not limited to this.

FIG. 3 illustrates the pixel array area PA of FIG. 2, as viewed in the third direction Z. That is, FIG. 3 illustrates the pixels PX of the pixel array area PA, as viewed from the bottom of the image sensor 100. The pixels PX may be arranged regularly in the first and second directions X and Y. That is, the pixel array area PA may include one pixel PX.

Referring to FIGS. 4 and 5, each of the pixels PX may include a semiconductor substrate 220, a photoelectric conversion layer PD, a transistor TR, and pixel separation patterns 225, but the present disclosure is not limited thereto. Alternatively, each of the pixels PX may not include the pixel separation patterns 225.

The semiconductor substrate 220 may include, for example, bulk silicon or silicon-on-insulator (SOI). The semiconductor substrate 220 may be a silicon substrate or may include a material other than silicon, such as, for example, silicon germanium, indium antimonide, a lead tellurium compound, indium arsenic, indium phosphide, gallium arsenide, or gallium antimonide. Alternatively, the semiconductor substrate 220 may be a base substrate having an epitaxial layer formed thereon. The semiconductor substrate 220 may have first and second surfaces SF1 and SF2 that are opposite to each other. In some embodiments, the second surface SF2 of the semiconductor substrate 220 may be a light-receiving surface upon which light is incident. Also, the first surface SF1 may be the front surface of the semiconductor substrate 220 and the second surface SF2 may be the rear surface of the semiconductor substrate 220.

In some embodiments, the transistor TR may be disposed on the front surface of the semiconductor substrate 220. The transistor TR may include, for example, at least one of various transistors (e.g., a transfer transistor, a reset transistor, a source follower transistor and a select transistor) that form each unit pixel of the image sensor 100. The transistor TR will hereinafter be described as being a transfer transistor of the image sensor 100.

The transistor TR may include a gate insulating film 222, a gate electrode 223, and impurity-injected areas 224_1. The gate insulating film 222 may be formed along a trench formed in the semiconductor substrate 220. The gate electrode 223 may fill the space defined by the gate insulating film 222. The impurity-injected areas 224_1 may be formed by doping impurities into the semiconductor substrate 220. The gate electrode 223 may serve as the gate of the transistor TR, and the impurity-injected areas 224_1 may serve as the source and drain of the transistor TR. Also, the impurity-injected areas 224_1 may correspond to, for example, floating diffusions.

The pixel separation patterns 225 may be disposed in the semiconductor substrate 220. The pixel separation patterns 225 may define each of a plurality of unit pixels. The unit pixels may be arranged two-dimensionally in a plan view. For example, the pixel separation patterns 225 may be formed in a lattice shape in a plan view to separate the unit pixels from one another. The pixel separation patterns 225 may be formed by burying deep trenches formed in the semiconductor substrate 220 through patterning with an insulating material. However, the present disclosure is not limited to this. Alternatively, each of the pixels PX may not include the pixel separation patterns 225. That is, the pixel separation patterns 225 may not be disposed in the semiconductor substrate 220.

In some embodiments, each of the pixel separation patterns 225 may include an insulating spacer film 226 and a conductive filling pattern 227. The insulating spacer film 226 may extend conformally along the side surfaces of a trench in the semiconductor substrate 220. The conductive filling pattern 227 may be formed on the insulating spacer film 226 to fill part of the trench in the semiconductor substrate 220. Each of the pixel separation patterns 225, including the conductive filling pattern 227, may be used as a storage gate SG that will be described later. That is, a voltage may be applied to the conductive filling pattern 227 of each of the pixel separation patterns 225, and as a result, each of the pixel separation patterns 225 may serve as the storage gate SG. Alternatively, the pixel separation patterns 225 may not be provided, and the storage gate SG and an insulating spacer film 228 may perform the functions of the pixel separation patterns 225.

Each of the pixels PX may include the photoelectric conversion layer PD. The photoelectric conversion layer PD may be formed in the semiconductor substrate 220. The photoelectric conversion layer PD may generate electric charge in proportion to the amount of light incident from the outside. The photoelectric conversion layer PD may be formed by doping impurities in the semiconductor substrate 220. For example, in a case where the semiconductor substrate 220 is doped with p-type impurities, the photoelectric conversion layer PD may be doped with n-type impurities. That is, the conductivity type of the impurities that the semiconductor substrate 220 is doped with may differ from the conductivity type of the impurities that the photoelectric conversion layer PD is doped with.

In some embodiments, each of the pixels PX may further include a surface insulating layer 210, grid patterns 250, a first liner 253, color filters CF, microlenses ML, and a second liner 254.

The surface insulating layer 210 may be deposited on the second surface SF2 of the semiconductor substrate 220. The grid patterns 250, the first liner 253, the color filters CF, the microlenses ML and the second liner 254 may be disposed in a region defined by the surface insulating layer 210.

The color filters CF may be formed on the surface insulating layer 210. The color filters CF may be arranged to correspond to the unit pixels. The color filters CF may be arranged two-dimensionally in a plan view. The microlenses ML may be formed on the color filters CF. The microlenses ML may be arranged to correspond to the unit pixels. The microlenses ML may have a convex shape with a predetermined radius of curvature. Accordingly, the microlenses ML can condense light incident upon the photoelectric conversion layer PD. The microlenses ML include, for example, a light-transmitting resin, but the present disclosure is not limited thereto. Here, the microlenses ML may cover one surface of each of the pixels PX.

The grid patterns 250 may be formed between the color filters CF. The grid patterns 250 may be formed on the surface insulating layer 210. The grid patterns 250 may include, for example, metal patterns 251 and low refractive index patterns 252. The metal patterns 251 and the low refractive index patterns 252 may be sequentially stacked on the surface insulating layer 210.

The first liner 253 may be formed on the surface insulating layer 210 and on the grid patterns 250. The first liner 253 may extend along the surfaces of the surface insulating layer 210 and the grid patterns 250. The first liner 253 may include, for example, aluminum oxide, but the present disclosure is not limited thereto.

The second liner 254 may extend along the surfaces of the microlenses ML. The second liner 254 may include, for example, an inorganic oxide film (e.g., silicon oxide, titanium oxide, zirconium oxide, hafnium oxide, or a combination thereof), but the present disclosure is not limited thereto.

In some embodiments, each of the pixels PX may further include an interwire insulating layer 230 and a connecting structure. The connecting structure may be formed in the interwire insulating layer 230. Here, the connecting structure may include a plurality of metal layers ML and a plurality of contacts MC. The elements of each of the pixels PX and the elements of the image sensor 100 may be electrically connected via the connecting structure.

In some embodiments, each of a plurality of pixels PX of a pixel array area PA1_1 may include p-type barriers PB, a storage diode SD, an insulating spacer film 228, a storage gate SG, and an impurity-injected area 224_2.

Referring to FIGS. 4 and 5, the photoelectric conversion layer PD may be disposed in the semiconductor substrate 220. The photoelectric conversion layer PD may be doped with n-type impurities, whereas the semiconductor substrate 220 is doped with p-type impurities. The photoelectric conversion layer PD may receive incident light through the microlenses (ML). The photoelectric conversion layer PD may convert the incident light into electric charge and may store the electric charge therein. The photoelectric conversion layer PD may not be exposed on the first and second surfaces SF1 and SF2 of the semiconductor substrate 220.

The p-type barriers PB may be formed in the semiconductor substrate 220. The p-type barriers PB may be disposed to be a predetermined distance apart from the photoelectric conversion layer PD. For example, the p-type barriers PB may be disposed around the photoelectric conversion layer PD and may surround the photoelectric conversion layer PD. For example, the p-type barriers PB may be formed to be spaced apart from the photoelectric conversion layer PD in the first and second directions X and Y. Also, the p-type barriers PB may extend in the third direction Z along the photoelectric conversion layer PD. That is, the p-type barriers PB may be vertically formed in the semiconductor substrate 220. The p-type barriers PB may be doped with p-type impurities, whereas the photoelectric conversion layer PD is doped with n-type impurities.

The insulating spacer film 228 and the storage gate SG may be formed in the semiconductor substrate 220. The insulating spacer film 228 and the storage gate SG may be vertically formed in the semiconductor substrate 220. Also, the insulating spacer film 228 and the storage gate SG may be formed to be spaced apart from the p-type barriers PB. The insulating spacer film 228 and the storage gate SG may be formed to be spaced apart from the p-type barriers PB in the first and second directions X and Y. Referring to FIG. 4, the insulating spacer film 228 and the storage gate SG may be formed in some part of each of the pixels PX. Here, the tops of the insulating spacer film 228 and the storage gate SG may be exposed at the first surface SF1 of the semiconductor substrate 220. The insulating spacer film 228 and the storage gate SG are illustrated as penetrating the semiconductor substrate 220, but the present disclosure is not limited thereto.

The insulating spacer film 228 may be formed in a trench that penetrates the first and second surfaces SF1 and SF2 of the semiconductor substrate 220. That is, the insulating spacer film 228 may be formed in a trench that extends in the third direction Z, in the semiconductor substrate 220. The insulating spacer film 228 may be conformally formed along the trench in the semiconductor substrate 220. The storage gate SG may be formed on the insulating spacer film 228 and may fill part of the trench in the semiconductor substrate 220. Here, the storage gate SG may be a type of conductive pattern.

The storage diode SD may be formed between the storage gate SG and the p-type barriers PB. The storage diode SD may be formed to be a predetermined distance from the p-type barriers PB and the storage gate SG. The storage diode SD may be formed along the storage gate SG and along the photoelectric conversion layer PD. For example, the storage diode SD may be vertically formed in the third direction Z along the storage gate SG or the photoelectric conversion layer PD. Also, the storage diode SD may be formed to correspond to the p-type barriers PB, but the present disclosure is not limited thereto. The storage diode SD may be doped with n-type impurities, whereas the p-type barriers PB and the semiconductor substrate 220 are doped with p-type impurities.

The impurity-injected area 224_2 may be formed at the first surface SF1 of the semiconductor substrate 220. The impurity-injected area 224_2 may be disposed adjacent to the storage diode SD and may cover the storage diode SD.

The transistor TR, the impurity-injected area 224_2, and the storage gate SG may be connected to a metal layer ML and a contact MC, which are disposed in the interwire insulating layer 230. For example, the transistor TR, the impurity-injected area 224_2, and the storage gate SG may be electrically connected by the metal layer ML and the contact MC. The transistor TR may be disposed on and adjacent to the photoelectric conversion layer PD, but the present disclosure is not limited thereto.

Each of the pixels PX may further include a read-out circuit RC and an insulating layer ISL. The read-out circuit RC may be connected to the transistor TR, the impurity-injected area 224_2, and the storage gate SG through the metal layer ML and the contact MC. The read-out circuit RC may be disposed in a different region from the photoelectric conversion layer PD, the transistor TR, the storage diode SD, and the storage gate SG. That is, the read-out circuit RC may be formed in a region where the other elements of each of the pixels PX are not disposed. Here, the read-out circuit RC may be isolated from the other elements of each of the pixels PX by the insulating layer ISL.

Figure 6A:
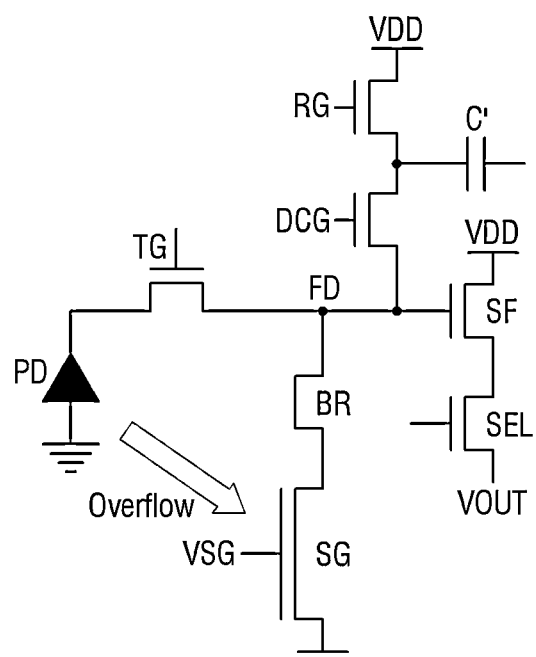
FIGS. 6A through 6C are circuit diagrams of pixels according to some embodiments of the present disclosure.
Figure 6B:
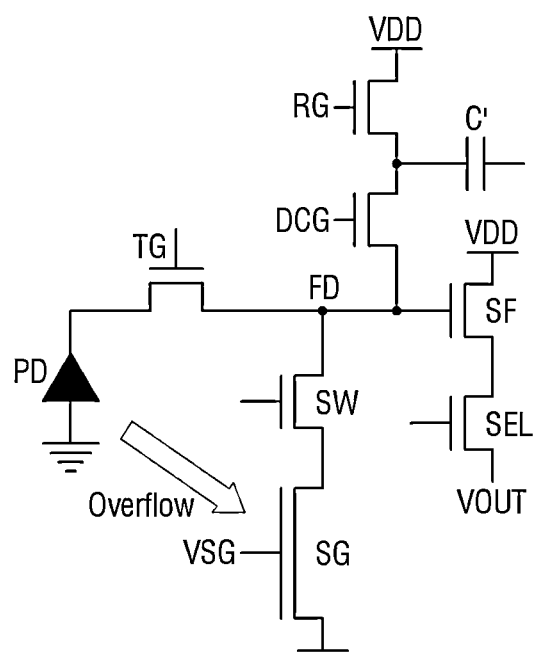
Figure 6C:
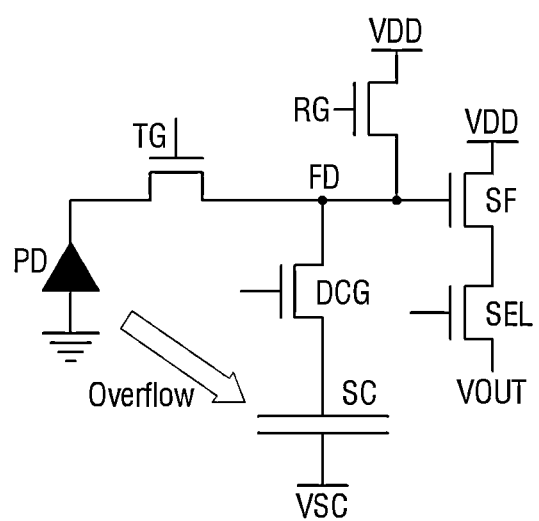
Figure 7A:
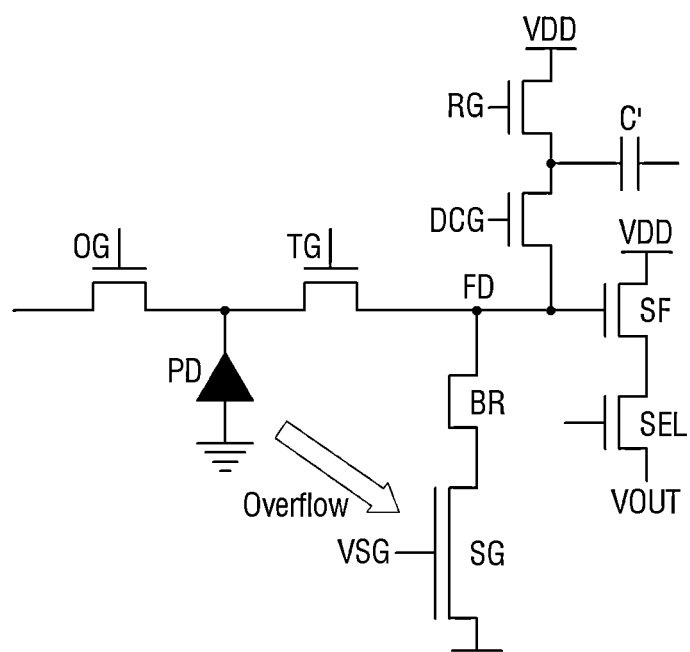
FIGS. 7A and 7B are circuit diagrams of pixels according to some embodiments of the present disclosure.
Figure 7B:
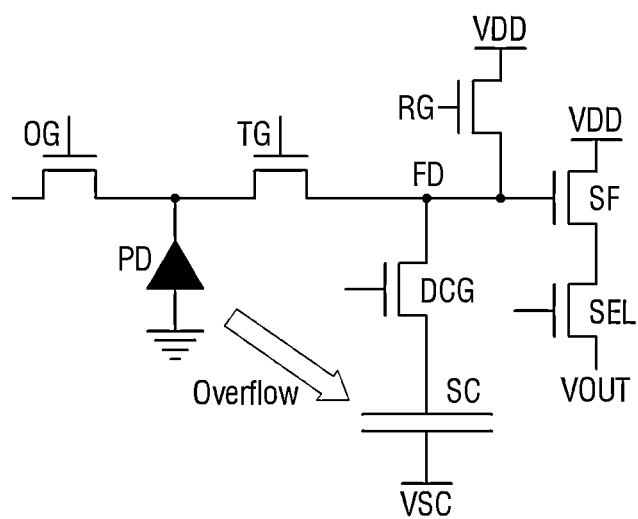

FIGS. 6A through 6C are circuit diagrams of pixels according to some embodiments of the present disclosure. FIGS. 7A and 7B are circuit diagrams of pixels according to some embodiments of the present disclosure.

The operation of each of the pixels PX in the pixel array area PA1_1 will hereinafter be described with reference to FIGS. 4 through 6A.

Referring to FIGS. 4 through 6A, the photoelectric conversion layer PD may be connected to the transistor TR. The gate electrode 223 of the transistor TR may correspond to a transfer gate TG. The impurity-injected area 224_1 may correspond to a floating diffusion FD. The floating diffusion FD may be connected to the storage gate SG through a barrier BR. That is, the photoelectric conversion layer PD and the storage gate SG may be electrically connected to the floating diffusion FD. Here, the barrier BR may correspond to the impurity-injected area 224_2.

Incident light passing through the microlenses ML may be incident upon the photoelectric conversion layer PD, and the photoelectric conversion layer PD may convert the incident light into electric charge. The electric charge may be stored in the photoelectric conversion layer PD. In this case, if the electric charge is excessive, some of the electric charge may overflow from the photoelectric conversion layer PD. That is, the overflow electric charge may be transmitted from the photoelectric conversion layer PD to the semiconductor substrate 220.

The electric charge generated by the photoelectric conversion layer PD may be transmitted to the floating diffusion FD or the impurity-injected area 224_1 through the transfer gate TG. The overflow electric charge from the photoelectric conversion layer PD may be transmitted to the storage diode SD through the p-type barriers PB. That is, the storage diode SD may store the overflow electric charge. The storage diode SD may be disposed between the photoelectric conversion layer PD and storage gate SG, but storage diode SD may be omitted in the FIG. 6A. A storage gate voltage VSG may be applied to the storage gate SG. As the storage gate voltage VSG is controlled, the amount of electric charge stored in the storage diode SD, which is adjacent to the storage gate SG, may change. Also, as the storage gate voltage VSG of the storage gate SG changes, the electric charge stored in the storage diode SD may be transmitted to the floating diffusion FD or the impurity-injected areas 224_1. The electric charge stored in the storage diode SD may be transmitted to the floating diffusion FD through the metal layer ML and the contact MC.

In short, the electric charge generated by the photoelectric conversion layer PD may be transmitted to the floating diffusion FD through the transfer gate TG and then to the floating diffusion FD through the storage diode SD. Here, the electric charge transmitted through the storage diode SD may correspond to the electric charge overflow from the photoelectric conversion layer PD. That is, the electric charge generated by the photoelectric conversion layer PD may be read out via two paths. As the overflow electric charge from the photoelectric conversion layer PD is stored and transmitted, a dynamic range can be expanded without the loss of optical electric charge, and leakage of electric charge from the floating diffusion FD can be reduced.

The electric charge transmitted to the floating diffusion FD may be used by a source follower transistor SF and a selection transistor SEL. As a result, the selection transistor SEL may output an output voltage VOUT to a column line connected to the pixel array 140. Also, each of the pixels PX may include a capacitor C', which is connected to the floating diffusion FD. The capacitor C' may be connected to the floating diffusion FD through a double conversion gate DCG. The capacitor C' may store the electric charge transmitted to the floating diffusion FD. That is, the capacitor C' may differ, and be distinguished, from the storage diode SD and the storage gate SG.

Referring to FIGS. 4 through 6B, each of the pixels PX may include a switch SW between the storage gate SG and the floating diffusion FD. Here, the storage diode SD, which is adjacent to the storage gate SG, may be connected to the switch SW, which is disposed in the semiconductor substrate 220 or the interwire insulating layer 230. Also, the switch SW may be connected to the floating diffusion FD. Accordingly, the overflow electric charge from the photoelectric conversion layer PD may be transmitted to the storage diode SD and then to the floating diffusion FD through the switch SW. That is, the switch SW may control the amount of electric charge transmitted from the storage diode SD.

Referring to FIGS. 4 through 6C, each of the pixels PX may include a capacitor SC and the double conversion gate DCG. Here, the capacitor SC may store the overflow electric charge from the photoelectric conversion layer PD. Here, the capacitor SC may be disposed between the photoelectric conversion layer PD and the double conversion gate DCG, and the storage diode SD and storage gate SG may be replaced by the capacitor SC. The capacitor SC may correspond to the storage gate SG and the storage diode SD. For example, the storage gate voltage VSG, which is applied to the storage gate SG, may be variable, but a capacitor voltage VSC, which is applied to the capacitor SC, may be fixed. However, the present disclosure is not limited to this. Alternatively, the capacitor SC may be substantially the same as the storage gate SG and the storage diode SD. The electric charge stored in the capacitor SC may be transmitted to the floating diffusion FD through the double conversion gate DCG.

Referring to FIGS. 7A and 7B, each of the pixels PX may further include an overflow gate OG. The overflow gate OG may be connected to the photoelectric conversion layer PD. Also, part of the overflow gate OG may be connected to the transfer gate TG. The overflow gate OG may intentionally remove the overflow electric charge from the photoelectric conversion layer PD. Here, the overflow gate OG may selectively operate. That is, when the overflow gate OG operates, the overflow electric charge may not be transmitted to the storage diode SD or the capacitor SC, and when the overflow gate OG does not operate, the overflow electric charge may be transmitted to the storage diode SD or the capacitor SC. Also, the overflow gate OG may perform a global reset operation, but the present disclosure is not limited thereto.

Figure 8:
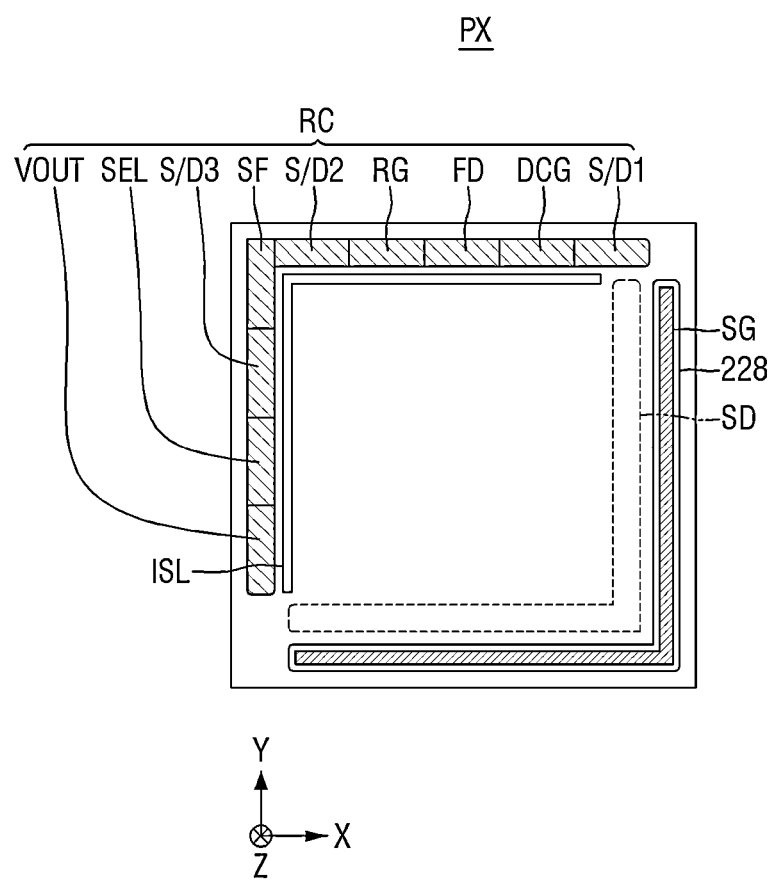
FIG. 8 is a layout view of a pixel according to some embodiments of the present disclosure.

FIG. 8 is a layout view of a pixel according to some embodiments of the present disclosure.

Referring to FIG. 8, a pixel PX may include a read-out circuit RC. For example, the read-out circuit RC may include a floating diffusion FD, a double conversion gate DCG, first, second, and third source drains S/D1, S/D2, and S/D3, a reset gate RG, a source follower transistor SF, and a selection transistor SEL. The read-out circuit RC may be formed in part of the pixel PX where a storage diode SD and a storage gate SG are not formed. Also, the read-out circuit RC may be insulated from the other elements of the pixel PX by an insulating layer ISL. Here, the floating diffusion FD may be connected to a transfer gate TG of the pixel PX, and electric charge generated by the photoelectric conversion layer PD may be transmitted to the read-out circuit RC. As a result, an output voltage VOUT may be output.

Figure 9:
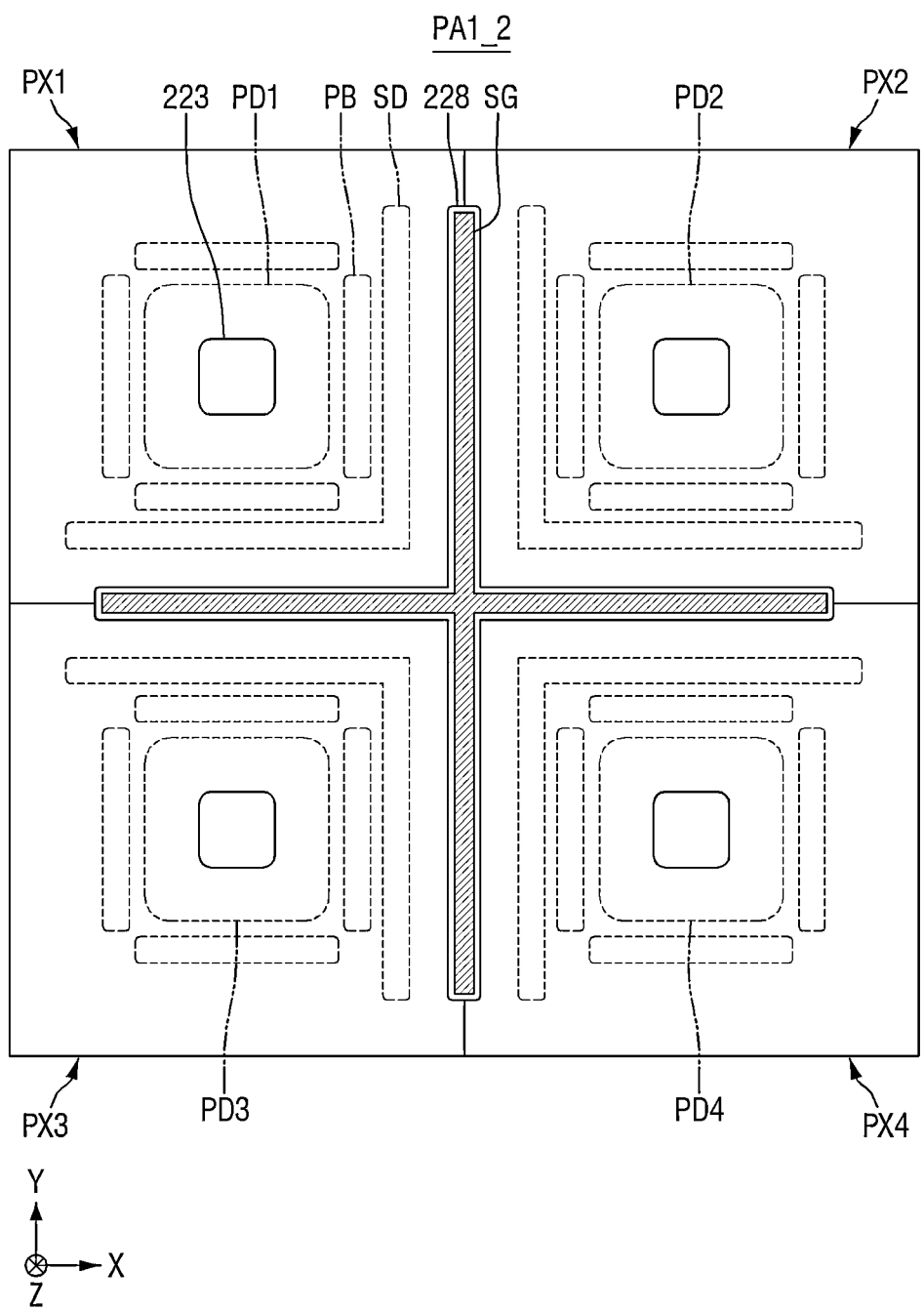
FIG. 9 is a layout view of a pixel array area according to some embodiments of the present disclosure.
Figure 10:
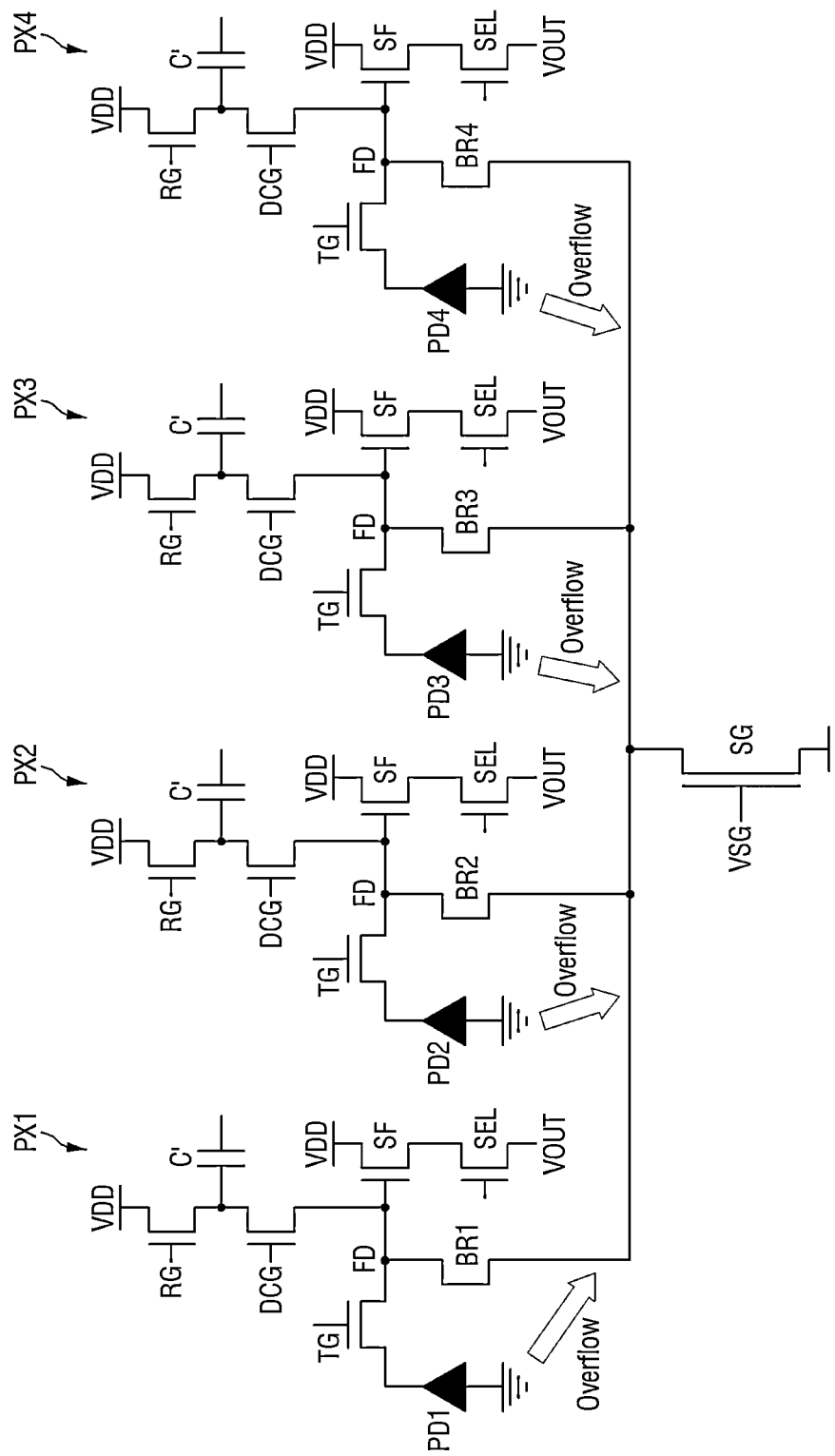
FIG. 10 is a circuit diagram of the pixel array area of FIG. 9.

FIG. 9 is a layout view of a pixel array area according to some embodiments of the present disclosure. FIG. 10 is a circuit diagram of the pixel array area of FIG. 9.

Referring to FIG. 9, a pixel array area PA1_2 may include first, second, third, and fourth pixels PX1, PX2, PX3, and PX4. The first, second, third, and fourth pixels PX1, PX2, PX3, and PX4 may include first, second, third, and fourth photoelectric conversion layers PD1, PD2, PD3, and PD4, respectively. Each of the first, second, third, and fourth pixels PX1, PX2, PX3, and PX4 may also include p-type barriers PB and a storage diode SD.

A storage gate SG and an insulating spacer film 228 may be formed along the boundaries between the first, second, third, and fourth pixels PX1, PX2, PX3, and PX4. That is, the first, second, third, and fourth pixels PX1, PX2, PX3, and PX4 may share the storage gate SG and the insulating spacer film 228. In response to a voltage being applied to the storage gate SG, electric charges overflowing from the first, second, third, and fourth photoelectric conversion layers PD1, PD2, PD3, and PD4 may be stored in the storage diodes SD of the first, second, third, and fourth pixels PX1, PX2, PX3, and PX4 and may be transmitted to floating diffusions FD of the first, second, third, and fourth pixels PX1, PX2, PX3, and PX4.

Referring to FIG. 10, the floating diffusions FD of the first, second, third, and fourth pixels PX1, PX2, PX3, and PX4 may be connected to the storage diodes SD or capacitors C' of the first, second, third, and fourth pixels PX1, PX2, PX3, and PX4. That is, the electric charges overflowing from the first, second, third, and fourth photoelectric conversion layers PD1, PD2, PD3, and PD4 of the first, second, third, and fourth pixels PX1, PX2, PX3, and PX4 may be transmitted to, and stored in, the storage diodes or the capacitors of the first, second, third, and fourth pixels PX1, PX2, PX3, and PX4 and may be transmitted to the floating diffusions FD of the first, second, third, and fourth pixels PX1, PX2, PX3, and PX4. Here, the first, second, third, and fourth pixels PX1, PX2, PX3, and PX4 may be connected to the storage diode SD with first, second, third, and fourth barriers BR1, BR2, BR3, and BR4. In the pixel array area PA1_2, the first, second, third, and fourth pixels PX1, PX2, PX3, and PX4 may share a storage diode SD and a capacitor C'. However, the present disclosure is not limited to this.

Figure 11:
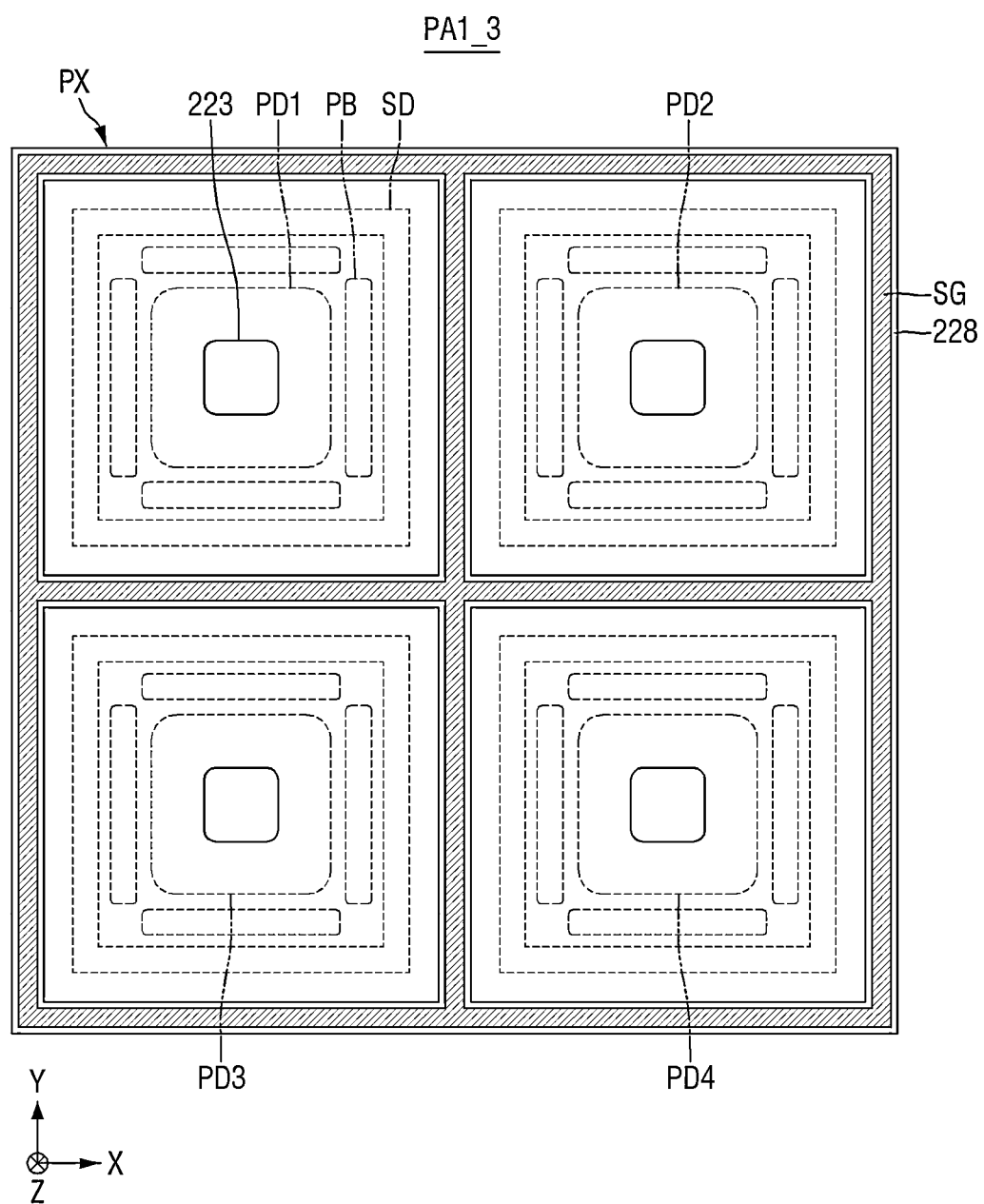
FIG. 11 is a layout view of a pixel array area according to some embodiments of the present disclosure.
Figure 12:
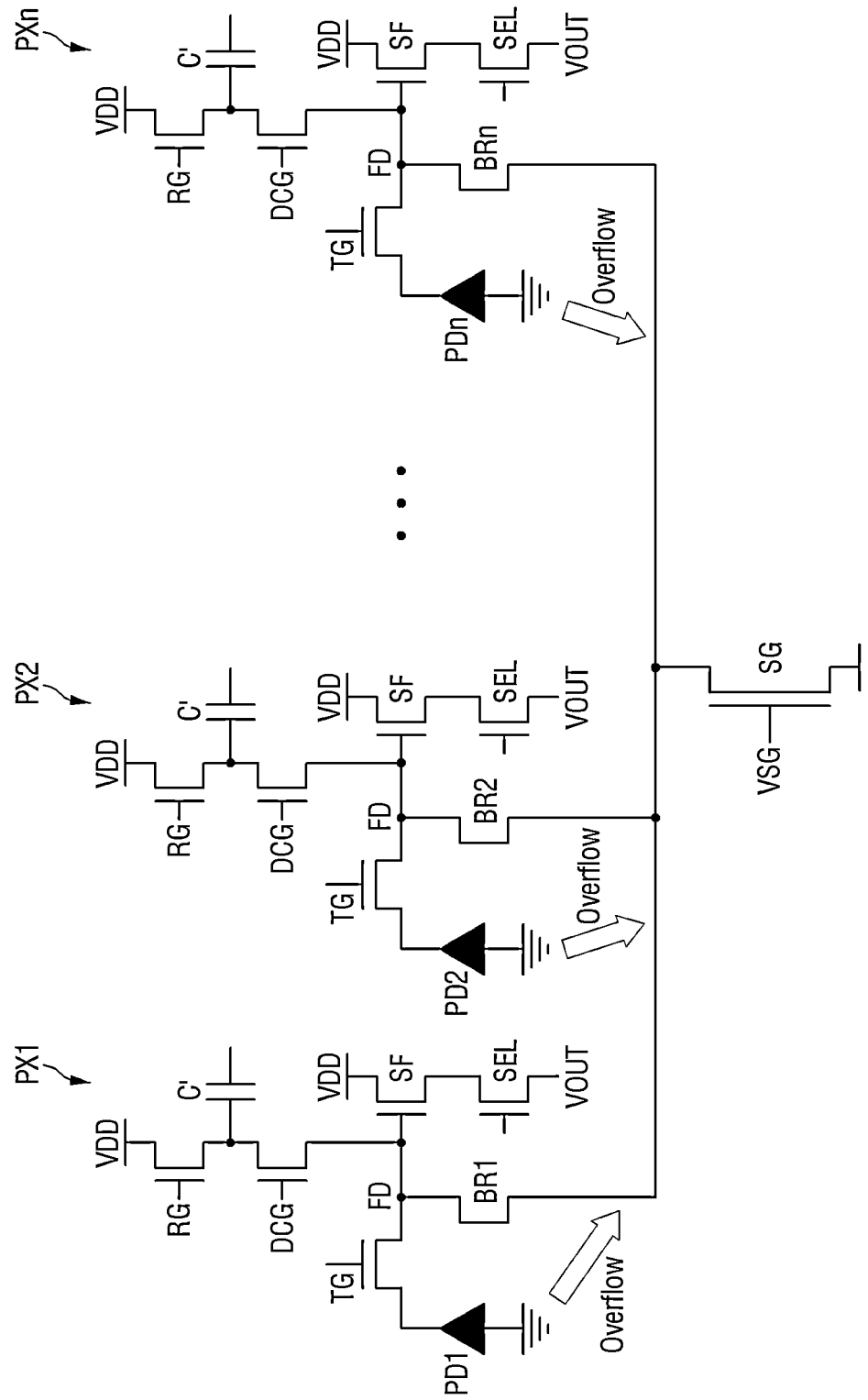
FIG. 12 is a circuit diagram of the pixel array area of FIG. 11.

FIG. 11 is a layout view of a pixel array area according to some embodiments of the present disclosure. FIG. 12 is a circuit diagram of the pixel array area of FIG. 11.

Referring to FIG. 11, a pixel array area PA1_3 may include a plurality of pixels PX. Each of the pixels PX may include a first photoelectric conversion layer PD1/PD2/PD3/PD4, p-type barriers PB, which surround the first photoelectric conversion layer PD1, and a storage diode SD, which surrounds the p-type barriers PB.

A storage gate SG and an insulating spacer film 228 may be formed along the boundaries between the pixels PX. For example, the storage gate SG and the insulating spacer film 228 may be provided, instead of pixel separation patterns 225, and may define the pixels PX. The storage gate SG and the insulating spacer film 228 may be formed to surround the storage diodes SD of the subpixels PX. The storage gate SG may operate as one body in response to a voltage being applied thereto.

Referring to FIG. 12, each of first through n-th pixels PX1 through PXn may be connected to a storage diode SD and a storage gate SG. Here, the first to nth pixels PX1 to PXn may be connected to the storage diode SD with first to nth barriers BR1 to BRn. That is, electric charges overflowing from photoelectric conversion layers PD (e.g., PD1, PD2, . . . PDn) of the first through n-th pixels PX1 through PXn may be stored in storage diodes SD of the first through n-th pixels PX1 through PXn and may be transmitted to floating diffusions FD of the first through n-th pixels PX1 through PXn. However, the present disclosure is not limited to this.

A pixel array area PA2_1 of an image sensor according to some embodiments of the present disclosure will hereinafter be described with reference to FIGS. 13 and 14.

Figure 13:
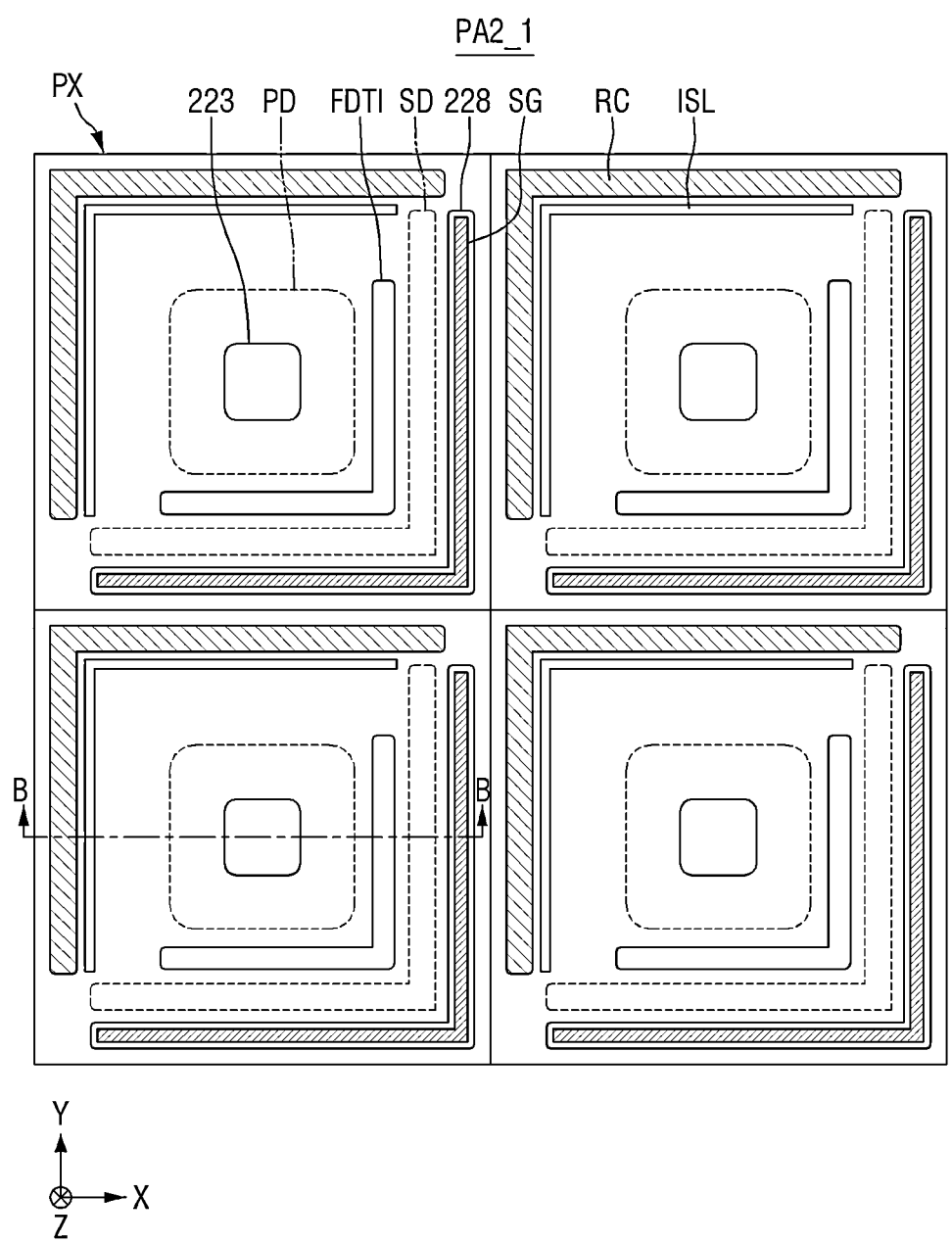
FIG. 13 is a layout view of a pixel array area according to some embodiments of the present disclosure.

FIG. 13 is a layout view of a pixel array area according to some embodiments of the present disclosure. FIG. 14 is a cross-sectional view taken along line B-B of FIG. 13. For convenience, descriptions of elements or features that have already been described above with reference to FIGS. 1 through 12 will be omitted or simplified.

Figure 14:
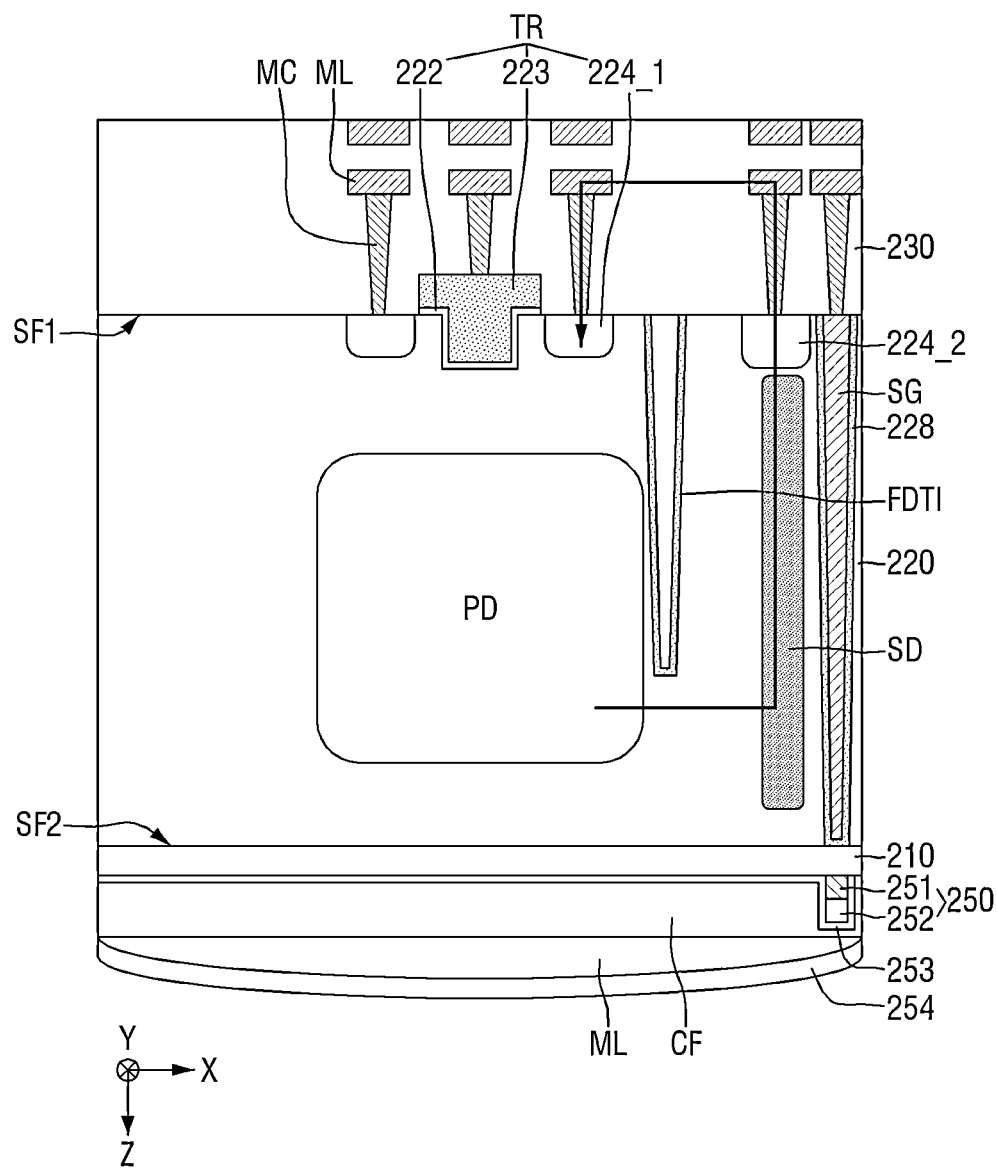
FIG. 14 is a cross-sectional view taken along line B-B of FIG. 13.

Referring to FIGS. 13 and 14, each of a plurality of pixels PX of a pixel array area PA2_1 may include a front separation pattern FDTI. In the embodiment of FIGS. 13 and 14, unlike in the embodiments of FIGS. 1 through 12, each of the pixels PX may not include p-type barriers PB. Also, in the embodiment of FIGS. 13 and 14, unlike in the embodiments of FIGS. 1 through 12, each of the pixels PX may not include pixel separation patterns 225. Not only in the embodiment of FIGS. 13 and 14, but also in embodiments that will be described later, each of the pixels PX may not include pixel separation patterns 225. Here, storage gates SG and insulating spacer films 228 may be used as pixel separation patterns 225.

The front separation pattern FDTI may extend from a first surface SF1 of a semiconductor substrate 220. The front separation pattern FDTI may be formed in a trench that extends from the first surface SF1 of the semiconductor substrate 220. Also, the front separation pattern FDTI may be exposed at the first surface SF1, but not at a second surface SF2 of the semiconductor substrate 220. The front separation pattern FDTI may be formed between a photoelectric conversion layer PD and the storage diode SD. That is, the front separation pattern FDTI may be vertically formed in a third direction Z along the photoelectric conversion layer PD.

The front separation pattern FDTI may include an insulating spacer film and a conductive pattern. The insulating spacer film may be conformally formed in a trench, and the conductive pattern may fill the trench, on the insulating spacer film. The bottom surface of the front separation pattern FDTI may be formed to be higher than the bottom surfaces of the photoelectric conversion layer PD and the storage diode SD. That is, the front separation pattern FDTI may be disposed in part, but not entirely, between the photoelectric conversion layer PD and the storage diode SD. That is, electric charge overflowing from the photoelectric conversion layer PD may be transmitted to the storage diode SD through a path spaced apart from the front separation pattern FDTI. In other words, the overflow electric charge may be read out through the storage diode SD.

Figure 15:
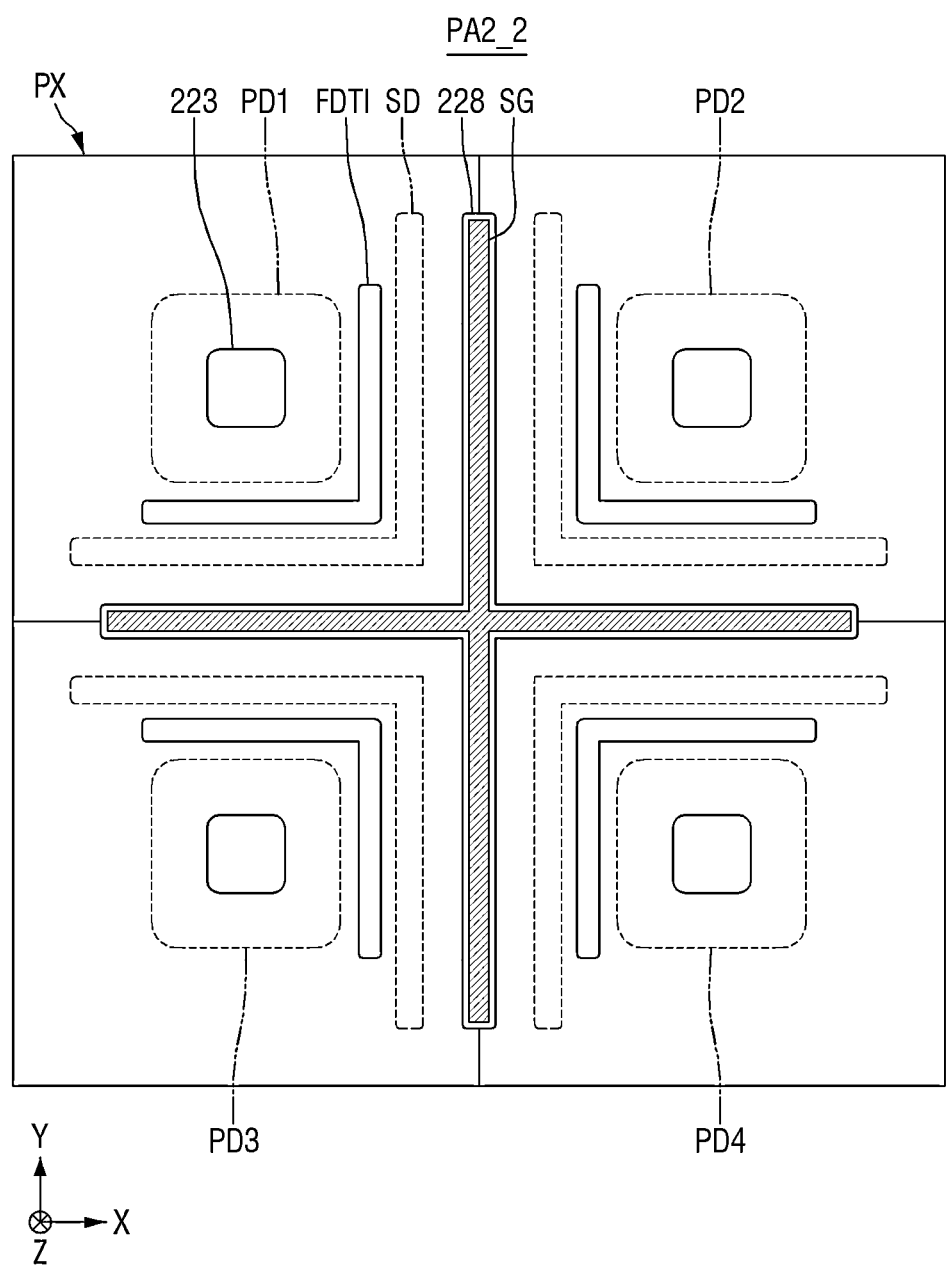
FIGS. 15 and 16 are layout views of pixel array areas according to some embodiments of the present disclosure.
Figure 16:
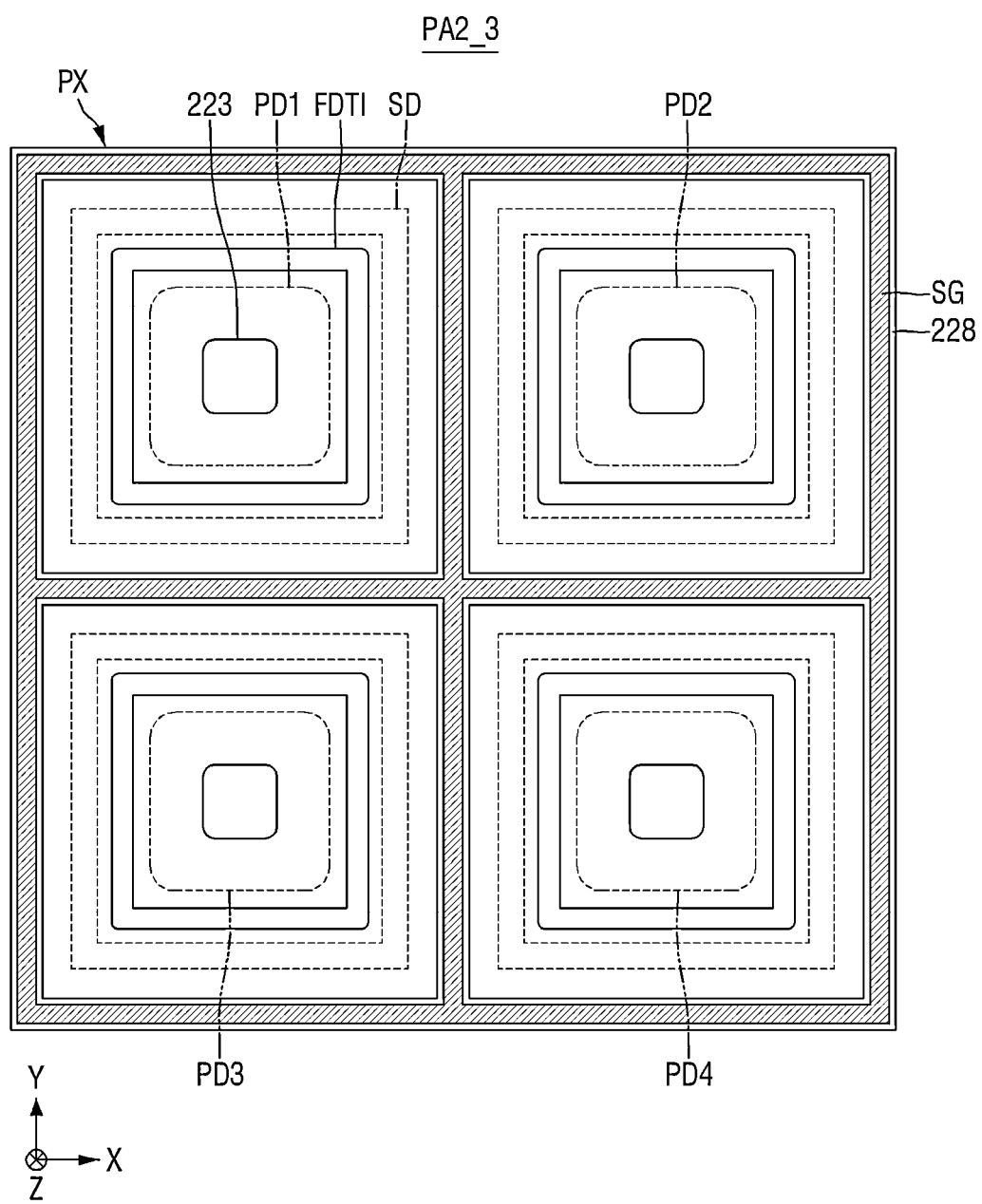

FIGS. 15 and 16 are layout views of pixel array areas according to some embodiments of the present disclosure.

Referring to FIG. 15, each of a plurality of pixels PX of a pixel array area PA2_2 may include a front separation pattern FDTI. The front separation pattern FDTI may be formed between a photoelectric conversion layer PD and a storage diode SD.

A storage gate SG and an insulating spacer film 228 may be formed along the boundaries between the pixels PX. That is, the pixels PX may share the storage gate SG and the insulating spacer film 228. In response to a voltage being applied to the storage gate SG, electric charges overflowing from first, second, third, and fourth photoelectric conversion layers PD1, PD2, PD3, and PD4 may be stored in storage diodes SD of the pixels PX and may be transmitted to floating diffusions FD of the pixels PX.

Referring to FIG. 16, each of a plurality of pixels PX of a pixel array area PA2_3 may include a front separation pattern FDTI. The front separation pattern FDTI may be formed between a photoelectric conversion layer PD and a storage diode SD. Here, the storage diode SD may be formed to surround the photoelectric conversion layer PD and the front separation pattern FDTI. Also, the front separation pattern FDTI may be formed to surround the photoelectric conversion layer PD.

The storage diode SD and an insulating spacer film 228 may be formed along the boundaries between the pixels PX. The storage gate SG and the insulating spacer film 228 may be formed to surround storage diodes SD of the pixels PX. The storage gate SG may operate as one body in response to a voltage being applied thereto.

A pixel array area PA2_4 of an image sensor 100 according to some embodiments of the present disclosure will hereinafter be described with reference to FIGS. 17 and 18.

Figure 17:
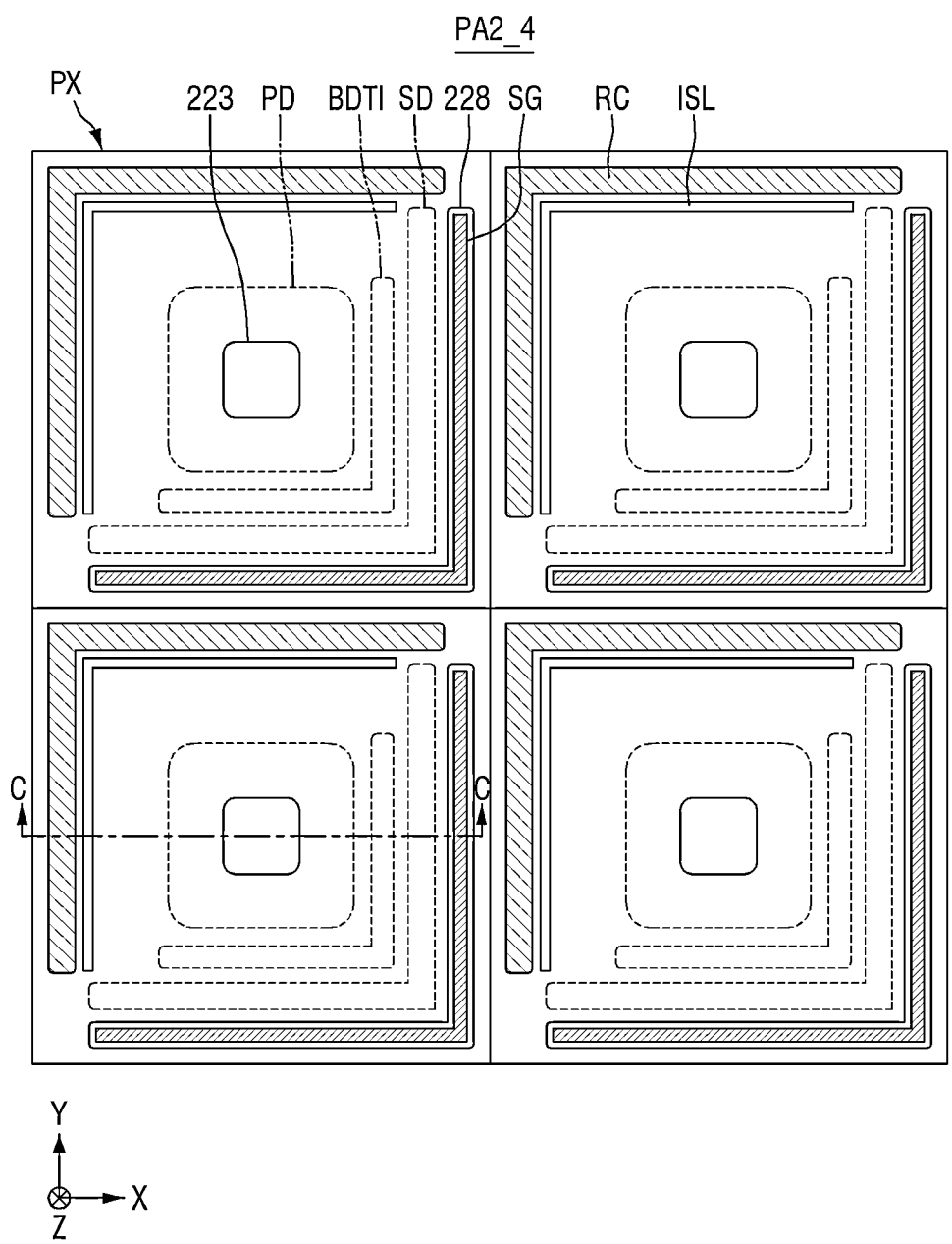
FIG. 17 is a layout view of a pixel array area according to some embodiments of the present disclosure.

FIG. 17 is a layout view of a pixel array area according to some embodiments of the present disclosure. FIG. 18 is a cross-sectional view taken along line C-C of FIG. 17. For convenience, descriptions of elements or features that have already been described above with reference to FIGS. 1 through 16 will be omitted or simplified.

Figure 18:
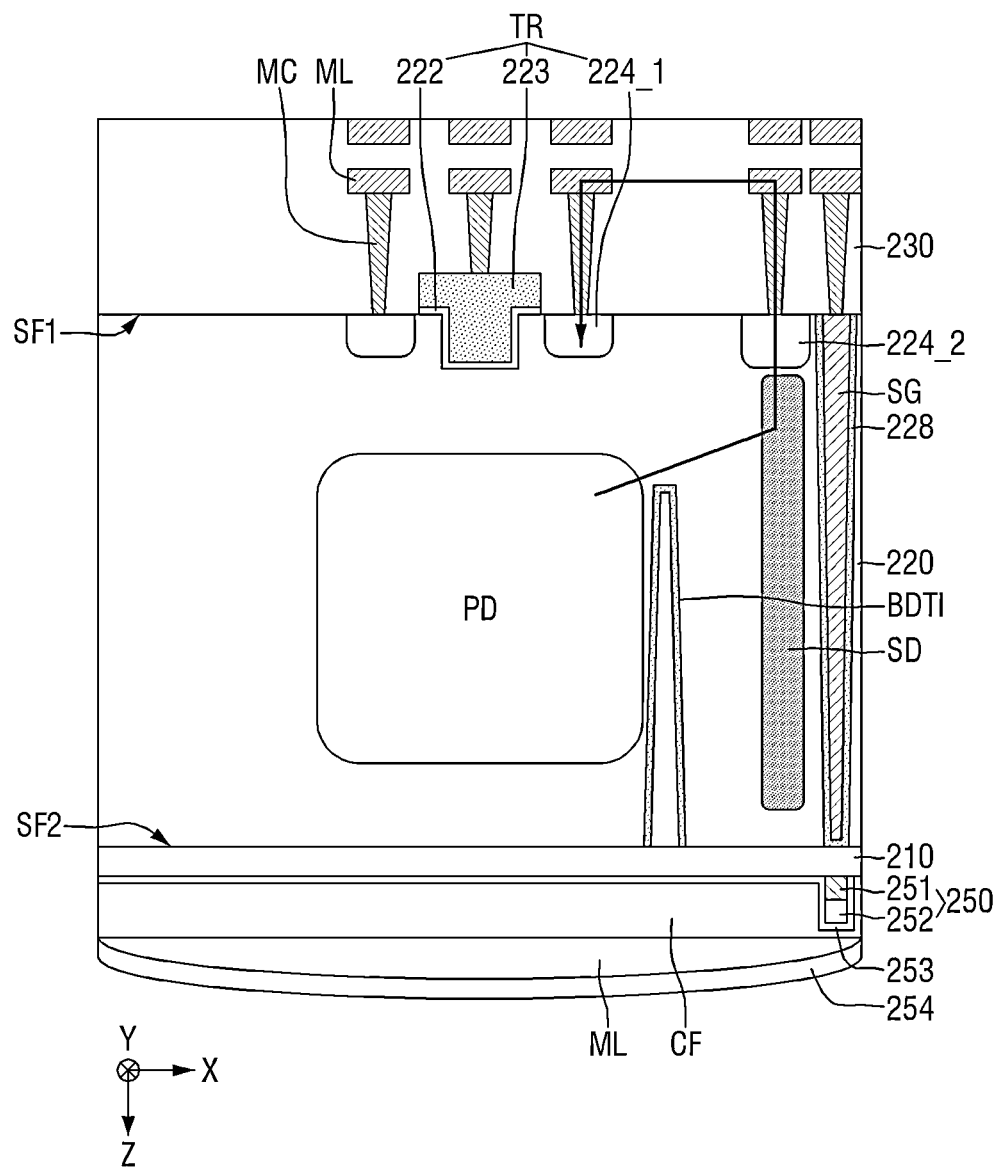
FIG. 18 is a cross-sectional view taken along line C-C of FIG. 17.

Referring to FIGS. 17 and 18, each of a plurality of pixels PX may include a rear separation pattern BDTI. In the embodiment of FIGS. 17 and 18, unlike in the embodiment of FIGS. 13 and 14, each of the pixels PX may include the rear separation pattern BDTI, instead of a front separation pattern FDTI.

The rear separation pattern BDTI may extend from a second surface SF2 of a semiconductor substrate 220. The rear separation pattern BDTI may be formed in a trench that extends from the first surface SF1 of the semiconductor substrate 220. Also, the rear separation pattern BDTI may be exposed at the second surface SF2, but not at a first surface SF1 of the semiconductor substrate 220. The rear separation pattern BDTI may be formed between a photoelectric conversion layer PD and a storage diode SD. That is, the rear separation pattern BDTI may be vertically formed in a third direction Z along the photoelectric conversion layer PD.

The rear separation pattern BDTI may include an insulating spacer film and a conductive pattern. The insulating spacer film may be conformally formed in a trench, and the conductive pattern may fill the trench, on the insulating spacer film. The top surface of the rear separation pattern BDTI may be formed to be lower than the top surfaces of the photoelectric conversion layer PD and the storage diode SD. That is, the rear separation pattern BDTI may be disposed in part, but not entirely, between the photoelectric conversion layer PD and the storage diode SD. That is, electric charge overflowing from the photoelectric conversion layer PD may be transmitted to the storage diode SD through a path spaced apart from the rear separation pattern BDTI. In other words, the overflow electric charge may be read out through the storage diode SD.

A pixel array area PA3_1 of an image sensor 100 according to some embodiments of the present disclosure will hereinafter be described with reference to FIGS. 19 and 20.

Figure 19:
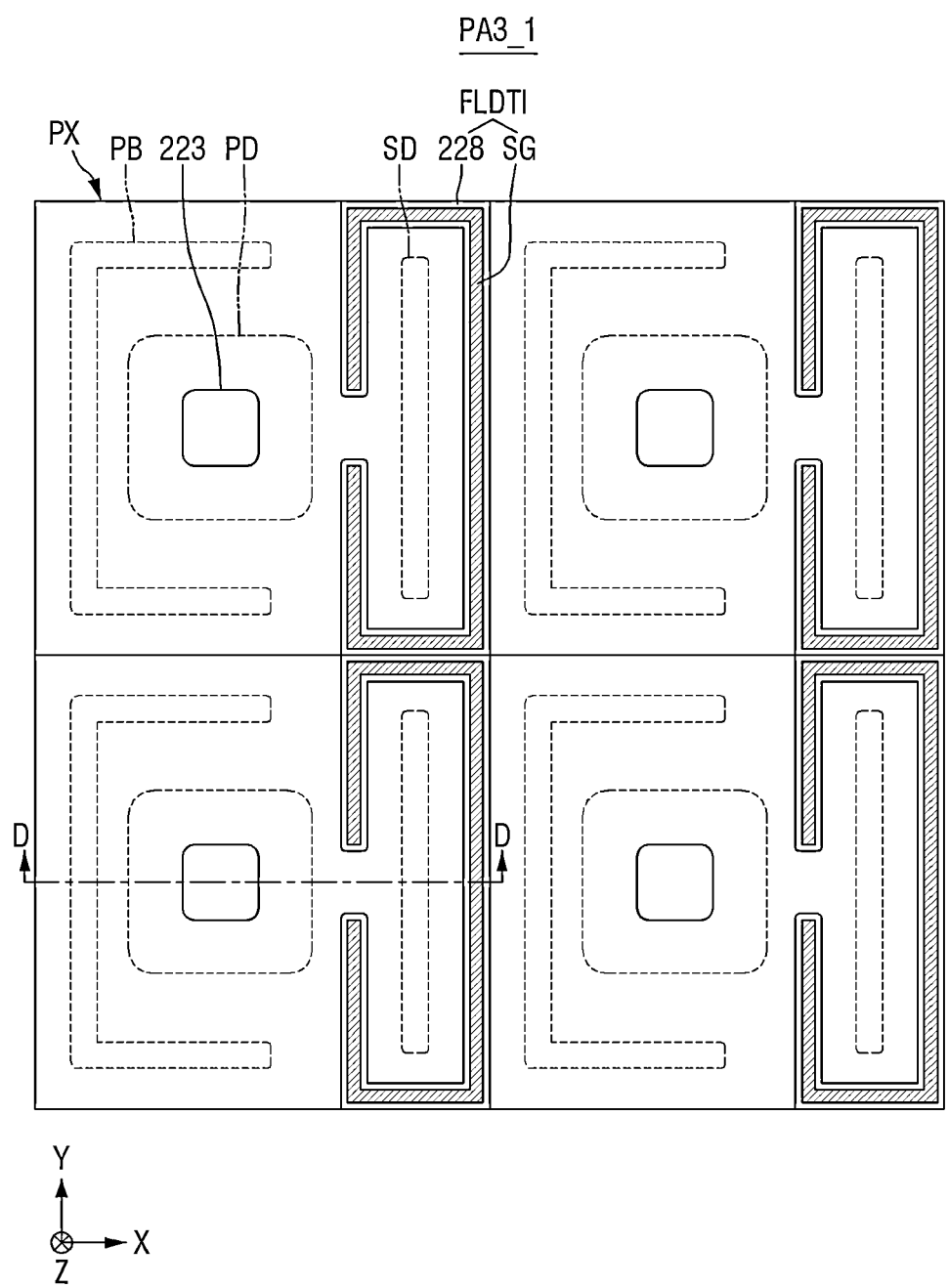
FIG. 19 is a layout view of a pixel array area according to some embodiments of the present disclosure.

FIG. 19 is a layout view of a pixel array area according to some embodiments of the present disclosure. FIG. 20 is a cross-sectional view taken along line D-D of FIG. 19. For convenience, descriptions of elements or features that have already been described above with reference to FIGS. 1 through 18 will be omitted or simplified.

Figure 20:
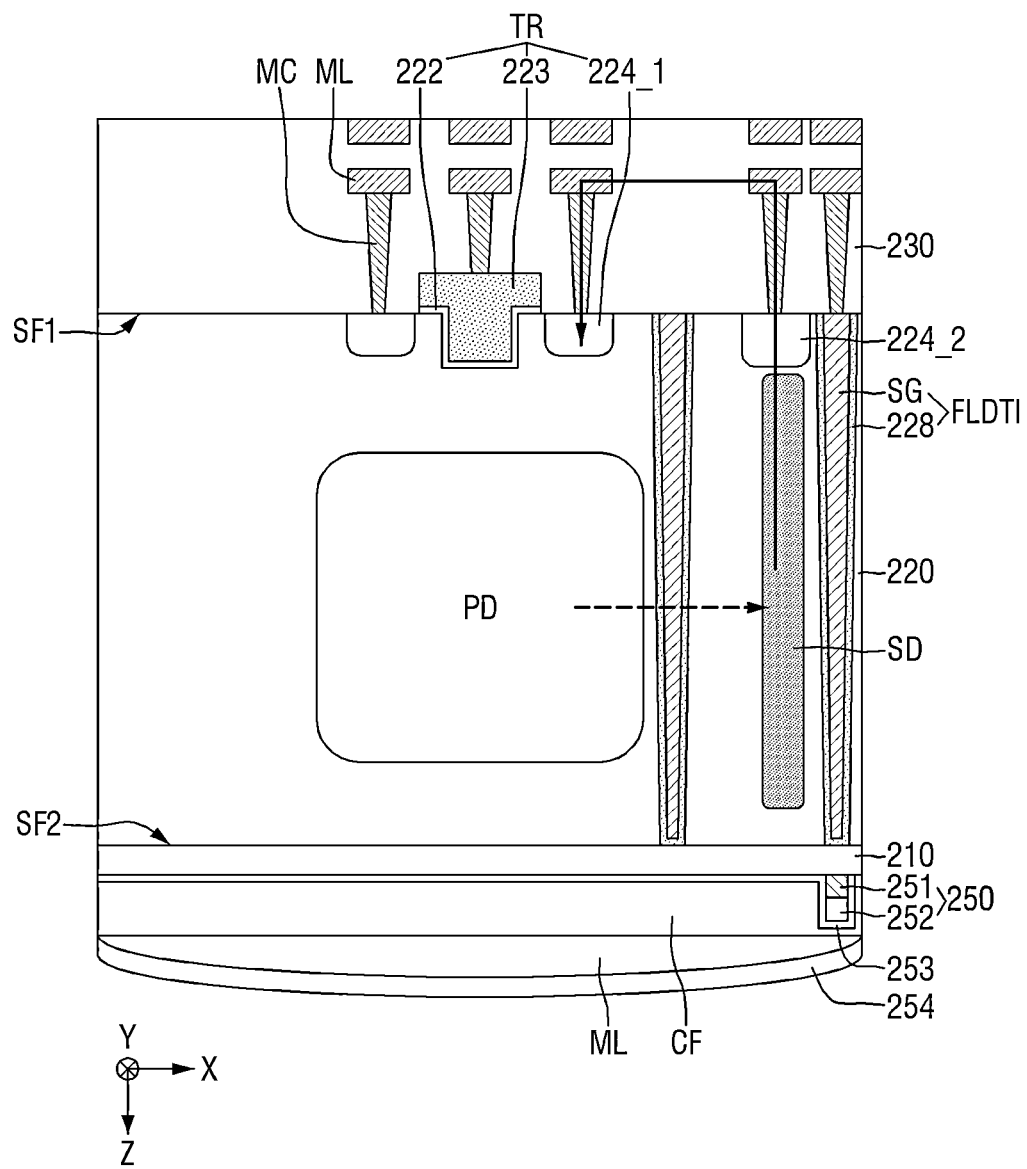
FIG. 20 is a cross-sectional view taken along line D-D of FIG. 19.

Referring to FIGS. 19 and 20, each of a plurality of pixels PX of the pixel array area PA3_1 may include a photoelectric conversion layer PD, p-type barriers PB, a storage diode SD, and a full separation pattern FLDTI. The p-type barriers PB may be disposed around part of the photoelectric conversion layer PD. Also, the full separation pattern FLDTI may be disposed to surround the storage diode SD and may be spaced apart from the photoelectric conversion layer PD in a first direction X.

The full separation pattern FLDTI may include an insulating spacer film 228 and a storage gate SG. The full separation pattern FLDTI may extend from a first surface SF1 to a second surface SF2 of a semiconductor substrate 220. The full separation pattern FLDTI may be formed to surround the storage diode SD, but part of the storage diode SD may not be surrounded by the full separation pattern FLDTI. For example, as illustrated in FIG. 19, part of the full separation pattern FLDTI may expose part of the storage diode SD. Accordingly, a path may be formed between the storage diode SD and the photoelectric conversion layer PD. That is, electric charge overflowing from the photoelectric conversion layer PD may be transmitted to the storage diode SD through the path exposed by the full separation pattern FLDTI. The amount of electric charge stored in the storage diode SD may be controlled in response to a voltage being applied to the storage gate SG of the full separation pattern FLDTI.

Figure 21:
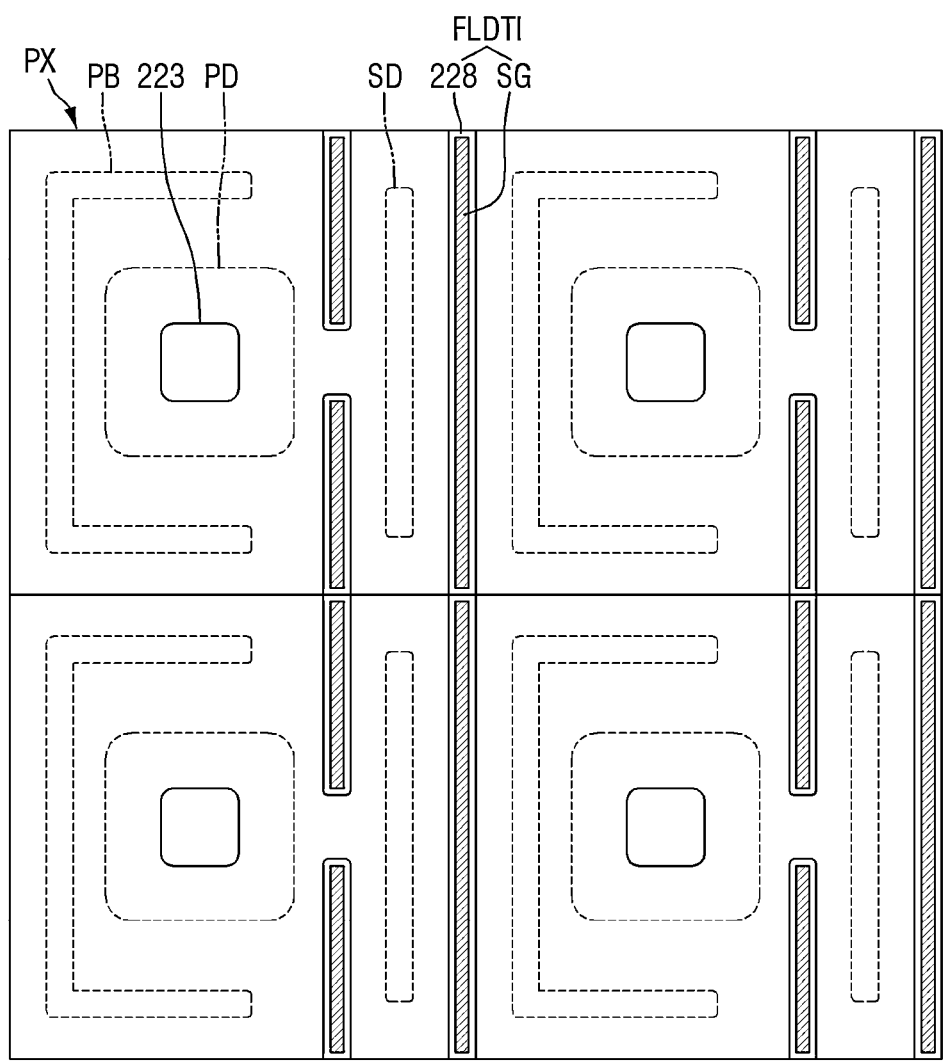
FIGS. 21 and 22 are layout views of pixel array areas according to some embodiments of the present disclosure.
Figure 22:
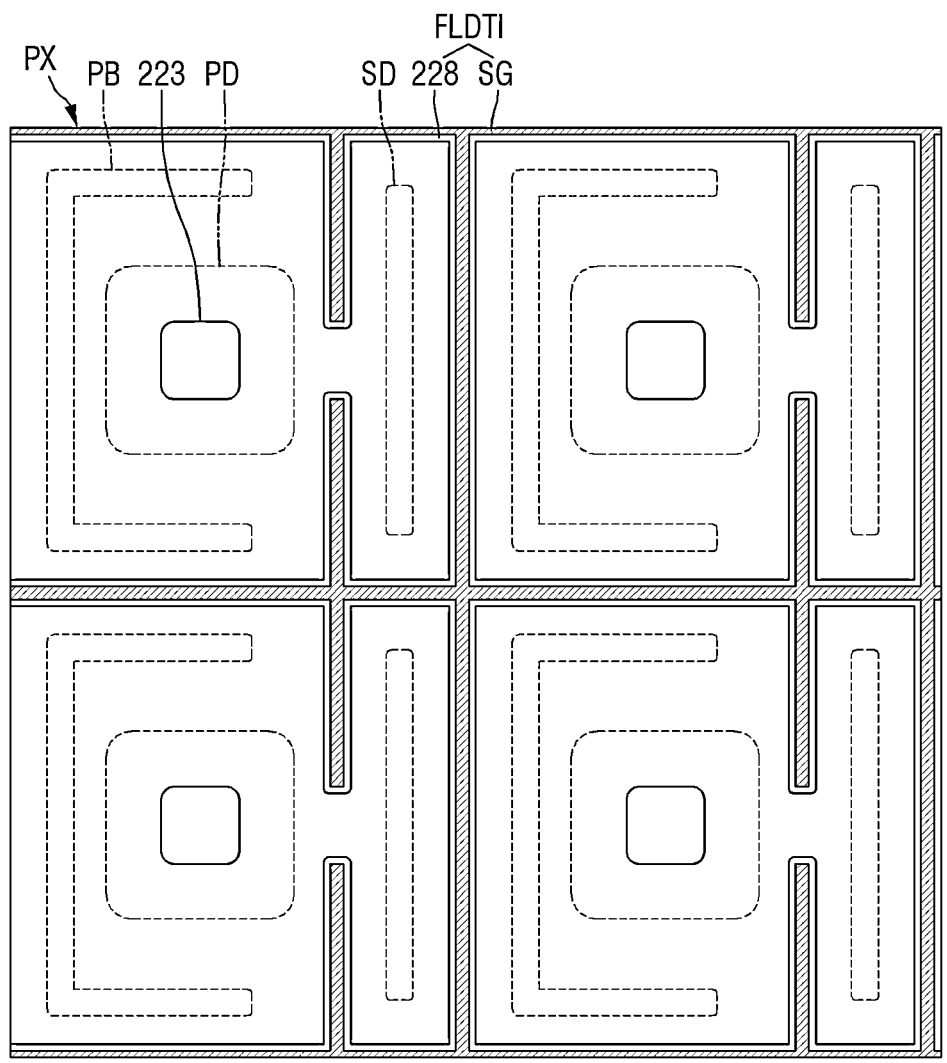

FIGS. 21 and 22 are layout views of pixel array areas according to some embodiments of the present disclosure.

Referring to FIG. 21, each of a plurality of pixels PX of a pixel array area PA3_2 may include a photoelectric conversion layer PD, p-type barriers PB, a storage diode SD, and a full separation pattern FLDTI. The full separation pattern FLDTI may be disposed around the storage diode SD and may be spaced apart from the photoelectric conversion layer PD in a first direction X.

For example, the full separation pattern FLDTI may be formed to extend in a second direction Y. Part of the full separation pattern FLDTI may be disposed between the photoelectric conversion layer PD and the storage diode SD, and another part of the full separation pattern FLDTI may be spaced apart from the storage diode SD in the first direction X. Electric charge overflowing from the photoelectric conversion layer PD may be transmitted to the storage diode SD through an open part of the full separation pattern FLDTI.

Referring to FIG. 22, each of a plurality of pixels PX of a pixel array area PA3_3 may include a photoelectric conversion layer PD, p-type barriers PB, a storage diode SD, and a full separation pattern FLDTI. The full separation pattern FLDTI may be disposed around the storage diode SD and around each of the pixels PX. For example, the full separation pattern FLDTI may be formed between the storage diode SD and the photoelectric conversion layer PD to surround each of the pixels PX. Electric charge overflowing from the photoelectric conversion layer PD may be transmitted to the storage diode SD through an open part of the full separation pattern FLDTI between the storage diode SD and the photoelectric conversion layer PD.

A pixel array area PA4 of an image sensor 100 according to some embodiments of the present disclosure will hereinafter be described with reference to FIGS. 23 through 26.

Figure 23:
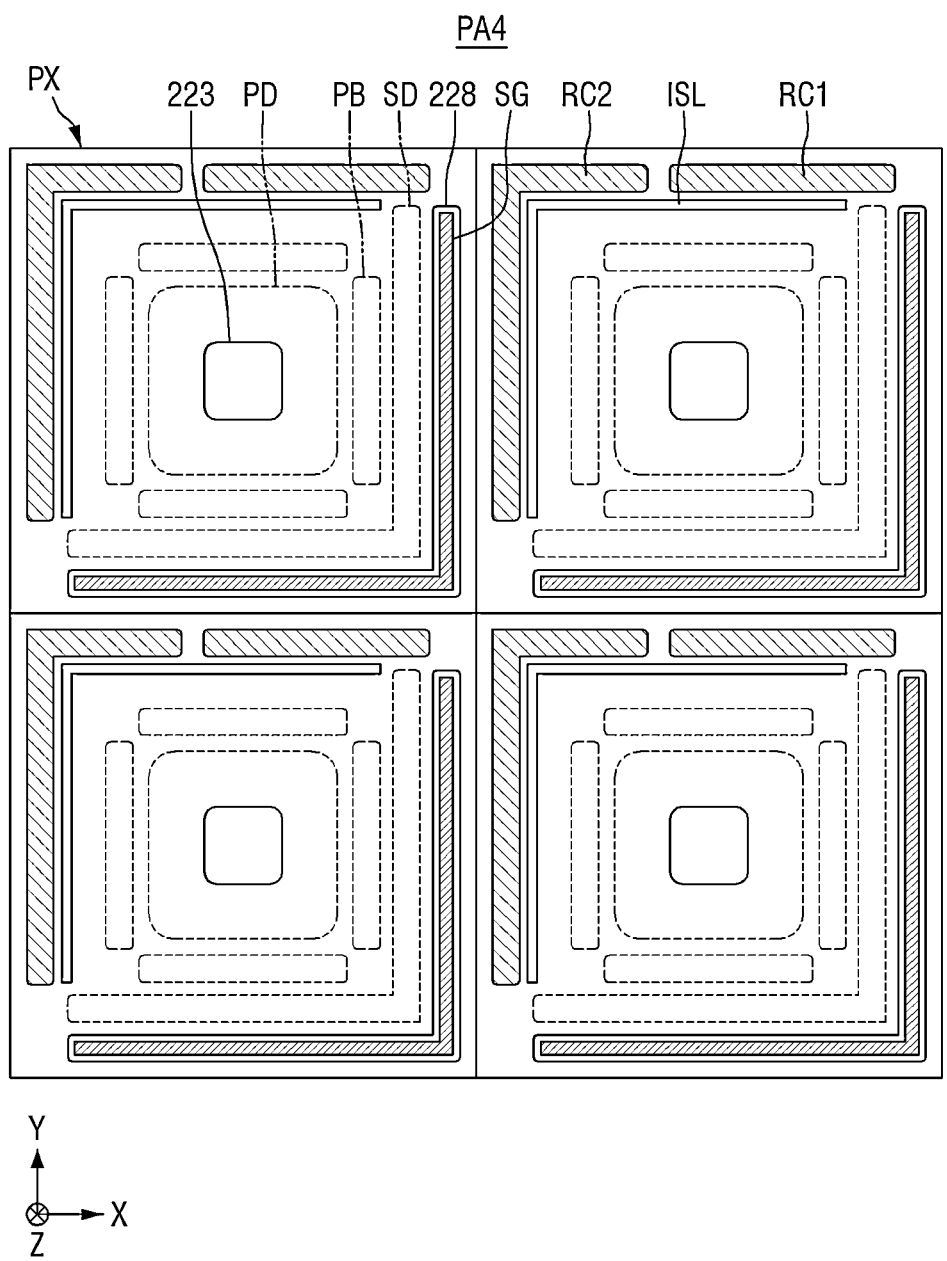
FIG. 23 is a layout view of a pixel array area according to some embodiments of the present disclosure.
Figure 24:
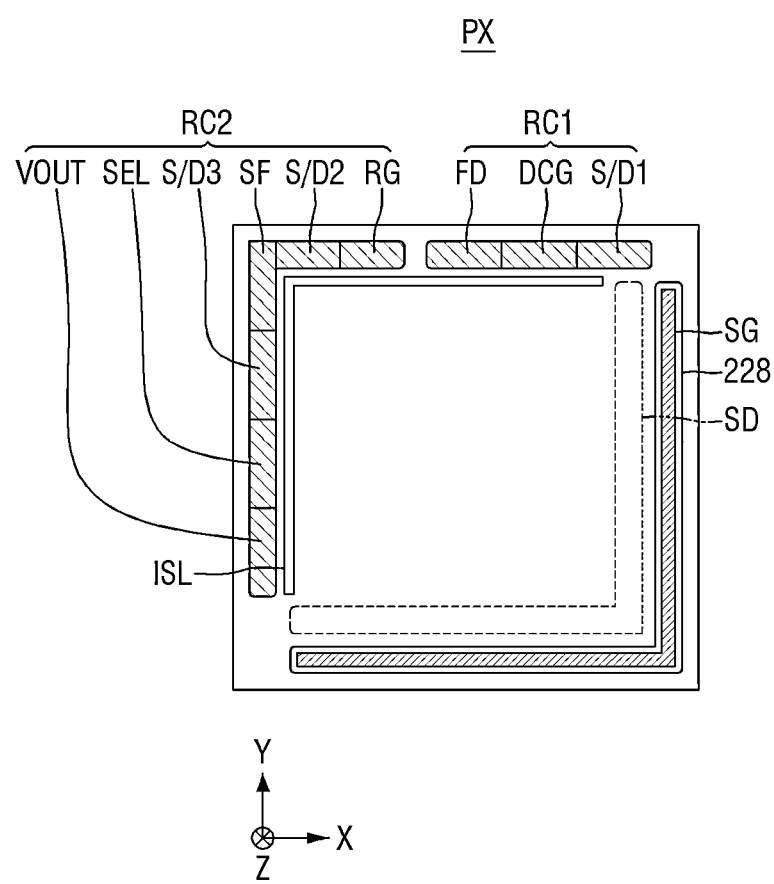
FIG. 24 is a layout view of a pixel of FIG. 23.
Figure 25:
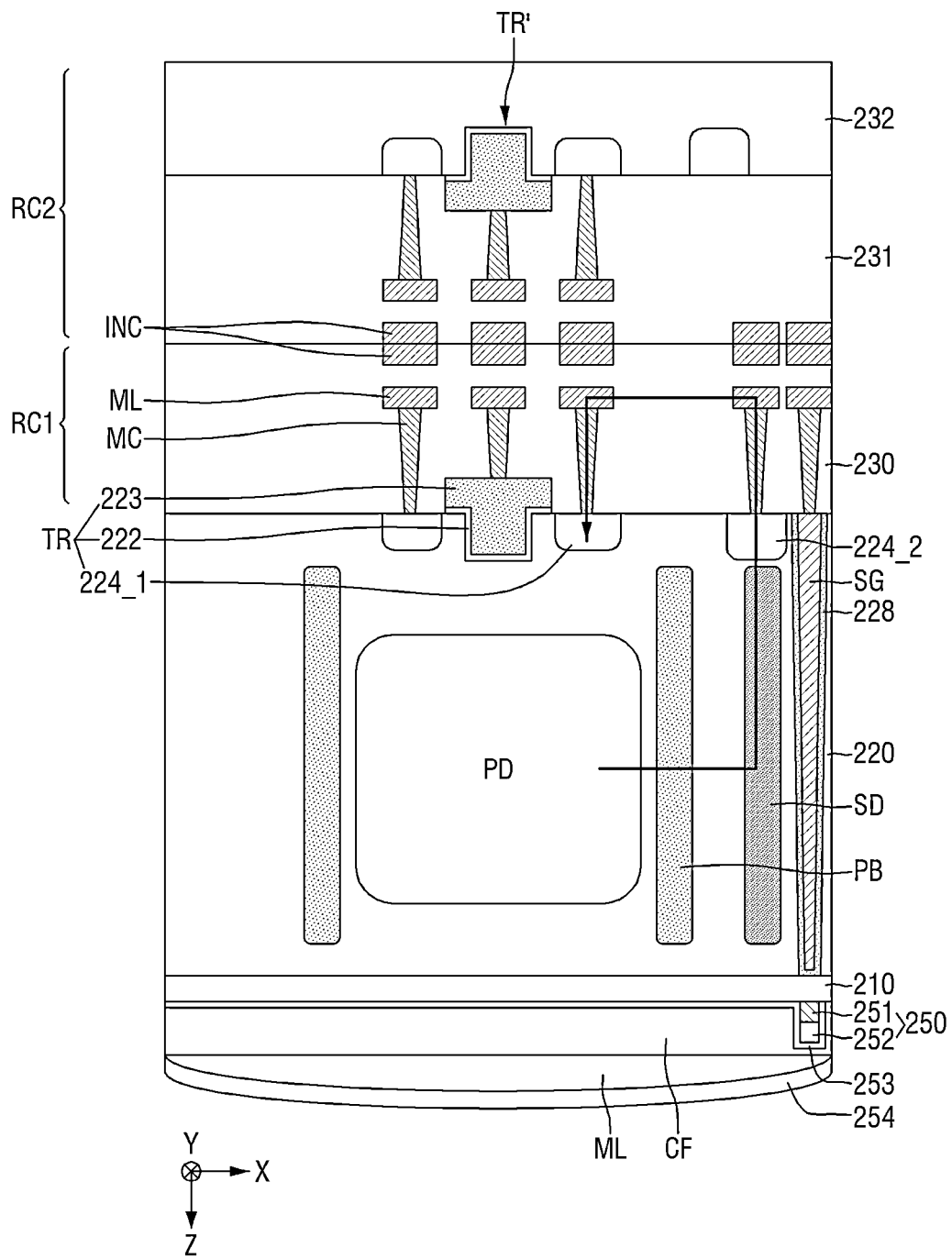
FIG. 25 is a cross-sectional view of the pixel array area of FIG. 23.
Figure 26:
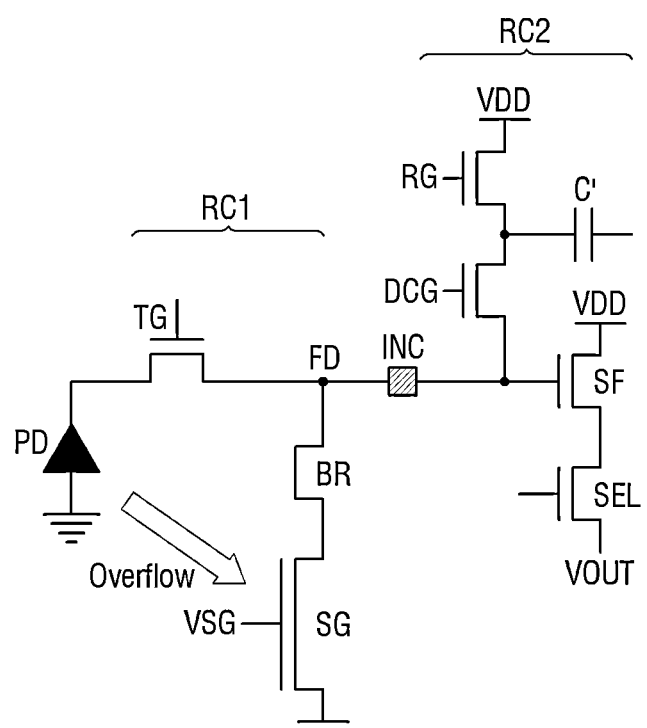
FIG. 26 is a circuit diagram of the pixel of FIG. 24.

FIG. 23 is a layout view of a pixel array area according to some embodiments of the present disclosure. FIG. 24 is a layout view of a pixel of FIG. 23. FIG. 25 is a cross-sectional view of the pixel array area of FIG. 23. FIG. 26 is a circuit diagram of the pixel of FIG. 24. For convenience, descriptions of elements or features that have already been described above with reference to FIGS. 1 through 12 will be omitted or simplified.

Referring to FIGS. 23 and 24, each of a plurality of pixels PX of the pixel array area PA4 may include first and second read-out circuits RC1 and RC2. For example, the first and second read-out circuits RC1 and RC2 may receive electric charge output from a photoelectric conversion layer PD. The first and second read-out circuits RC1 and RC2 may differ, and be spaced apart from, each other.

For example, the first read-out circuit RC1 may include a floating diffusion FD, a double conversion gate DCG, and a first source/drain S/D1. Also, for example, the second read-out circuit RC2 may include a reset gate RG, a second source/drain S/D2, a source follower transistor SF, a third source/drain S/D3, and a selection transistor SEL. However, the present disclosure is not limited to these examples, and each of the first and second read-out circuits RC1 and RC2 may have a different structure from that illustrated in FIG. 24.

Referring to FIGS. 25 and 26, each of the pixels PX of the pixel array area PA4 may include the first and second read-out circuits RC1 and RC2, which are disposed on a semiconductor substrate 220. The first read-out circuit RC1 may be implemented in the semiconductor substrate 220 and an interwire insulating layer 230, and the second read-out circuit RC2 may be implemented in a semiconductor substrate 232 and an interwire insulating layer 231. The first and second read-out circuits RC1 and RC2 may be connected through an interconnect INC. For example, the interconnect INC may be a Cu—Cu bonding, but the present disclosure is not limited thereto. The interconnect INC may include a through via.

The floating diffusion FD of the first read-out circuit RC1 and the second read-out circuit RC2 may be connected through the interconnect INC. That is, a transfer gate TG and the floating diffusion FD may be implemented in the interwire insulating layer 230, and other semiconductor elements may be implemented by the second read-out circuit RC2. In other words, a transistor TR' may be included in the second read-out circuit RC2 and may be connected to a transistor TR through the interconnect INC.

A pixel array area PA5_1 of an image sensor 100 according to some embodiments of the present disclosure will hereinafter be described with reference to FIGS. 27 and 28.

Figure 27:
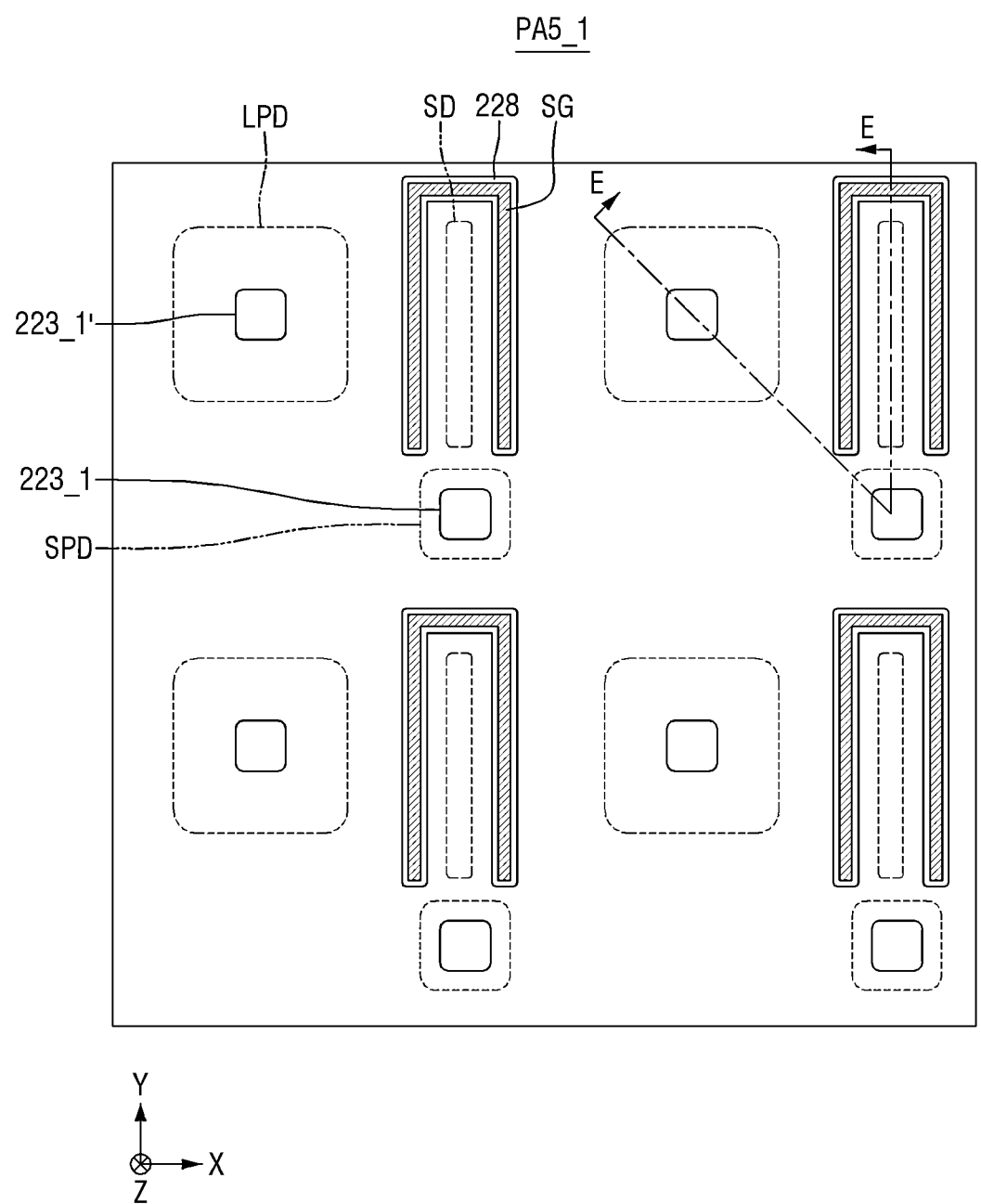
FIG. 27 is a layout view of a pixel array area according to some embodiments of the present disclosure.

FIG. 27 is a layout view of a pixel array area according to some embodiments of the present disclosure. FIG. 28 is a cross-sectional view taken along line E-E of FIG. 27. For convenience, descriptions of elements or features that have already been described above with reference to FIGS. 1 through 8 will be omitted or simplified.

Figure 28:
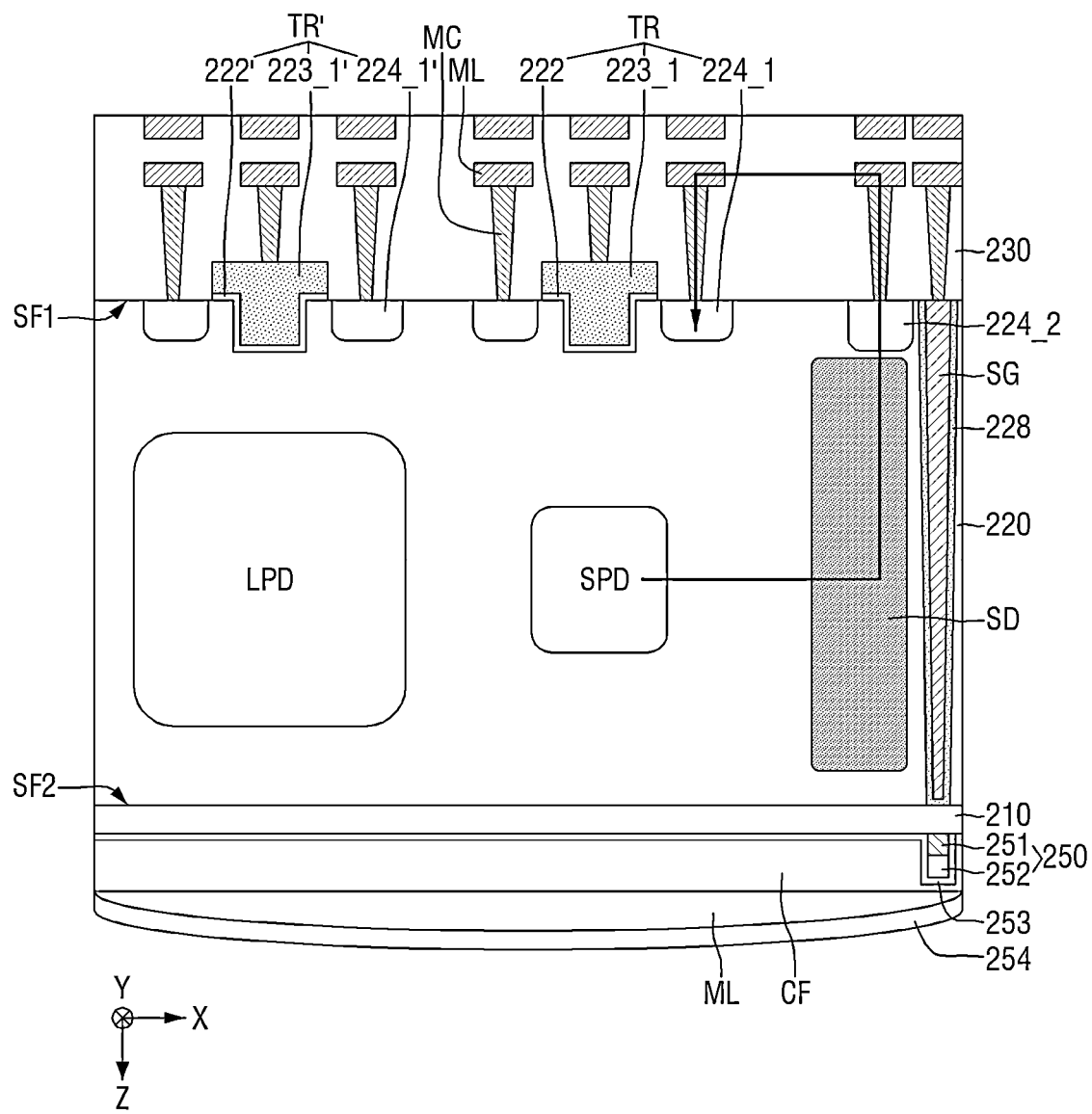
FIG. 28 is a cross-sectional view taken along line E-E of FIG. 27.

Referring to FIGS. 27 and 28, the pixel array area PA5_1 may include first photoelectric conversion layers LPD, second photoelectric conversion layers SPD, first gate electrodes 223_1', second gate electrodes 223_1, storage diodes SD, insulating spacer films 228, and storage gates SG.

Referring to FIG. 28, first and second photoelectric conversion layers LPD and SPD may be formed in a semiconductor substrate 220 to be spaced apart from one another. Also, a first gate electrode 223_1' of a transistor TR' may be formed in the second photoelectric conversion layer SPD. For example, the first gate electrode 223_1' may be connected to the first photoelectric conversion layer LPD, and a second gate electrode 223_1 may be connected to a second photoelectric conversion layer SPD. However, the second gate electrode 223_1 may not be formed on the second photoelectric conversion layer SPD. In this case, the second photoelectric conversion layer SPD may be directly connected to a storage diode SD and may change the voltage of a storage gate SG, and as a result, electric charge may move. Also, as the first and second photoelectric conversion layers LPD and SPD share a floating diffusion, each pixel can be further miniaturized.

The first and second photoelectric conversion layers LPD and SPD may both be doped with n-type impurities. The size of a doped part of the first photoelectric conversion layer LPD may be greater than the size of a doped part of the second photoelectric conversion layer SPD.

The storage gate SG, an insulating spacer film 228, and the storage diode SD may be formed adjacent to the second photoelectric conversion layer SPD. Also, the storage diode SD may be isolated from the first photoelectric conversion layer LPD by the insulating spacer film 228. Open parts of the storage gate SG and the insulating spacer film 228 may be adjacent to the second photoelectric conversion layer SPD. The storage diode SD may be formed between the storage gate SG and the second photoelectric conversion layer SPD.

Electric charge overflowing from the second photoelectric conversion layer SPD may be transmitted to the storage diode SD and may thus be read out. In this case, overflow electric charge from the first photoelectric conversion layer LPD may not be transmitted to the storage diode SD, but the present disclosure is not limited thereto.

Figure 29:
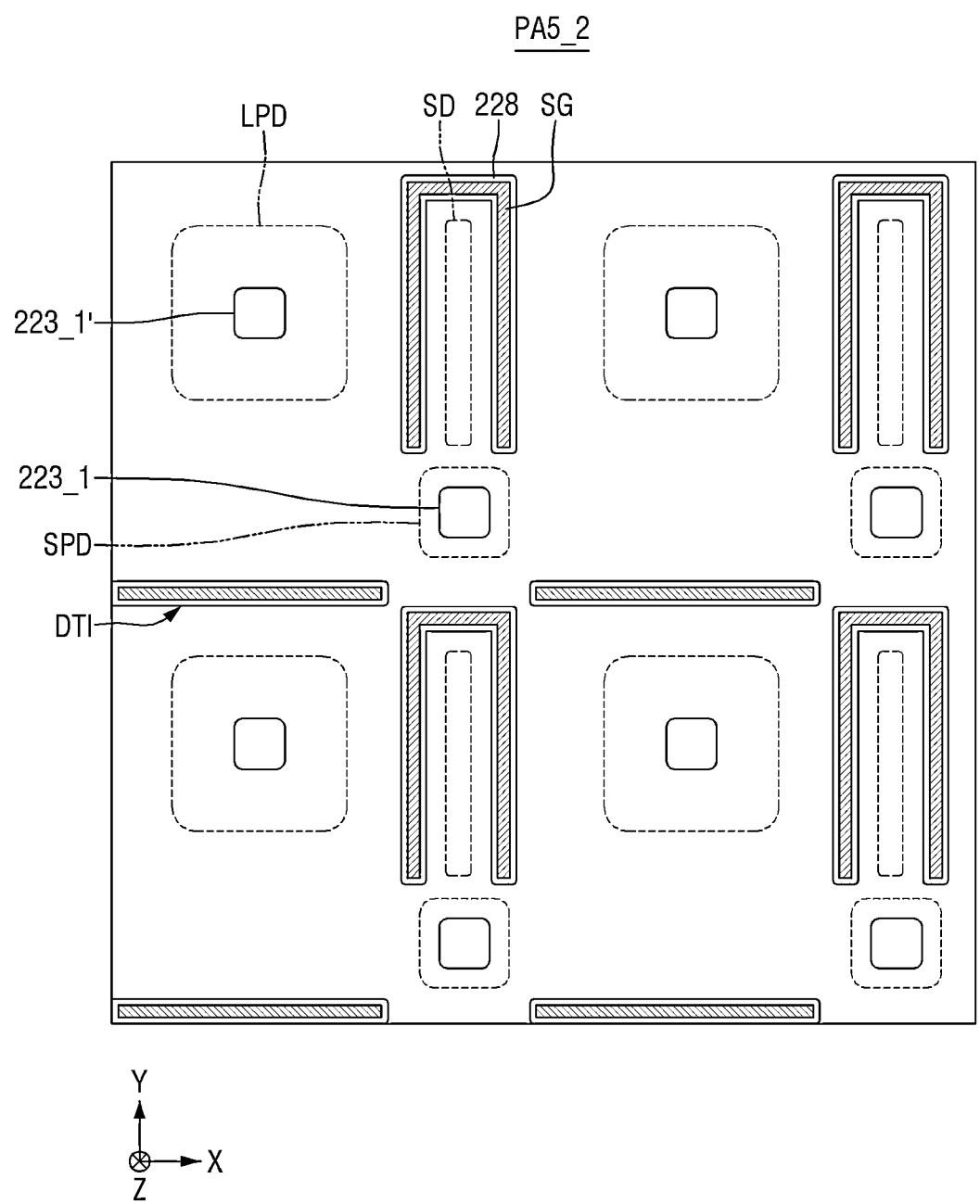
FIGS. 29 and 30 are layout views of pixel array areas according to some embodiments of the present disclosure.
Figure 30:
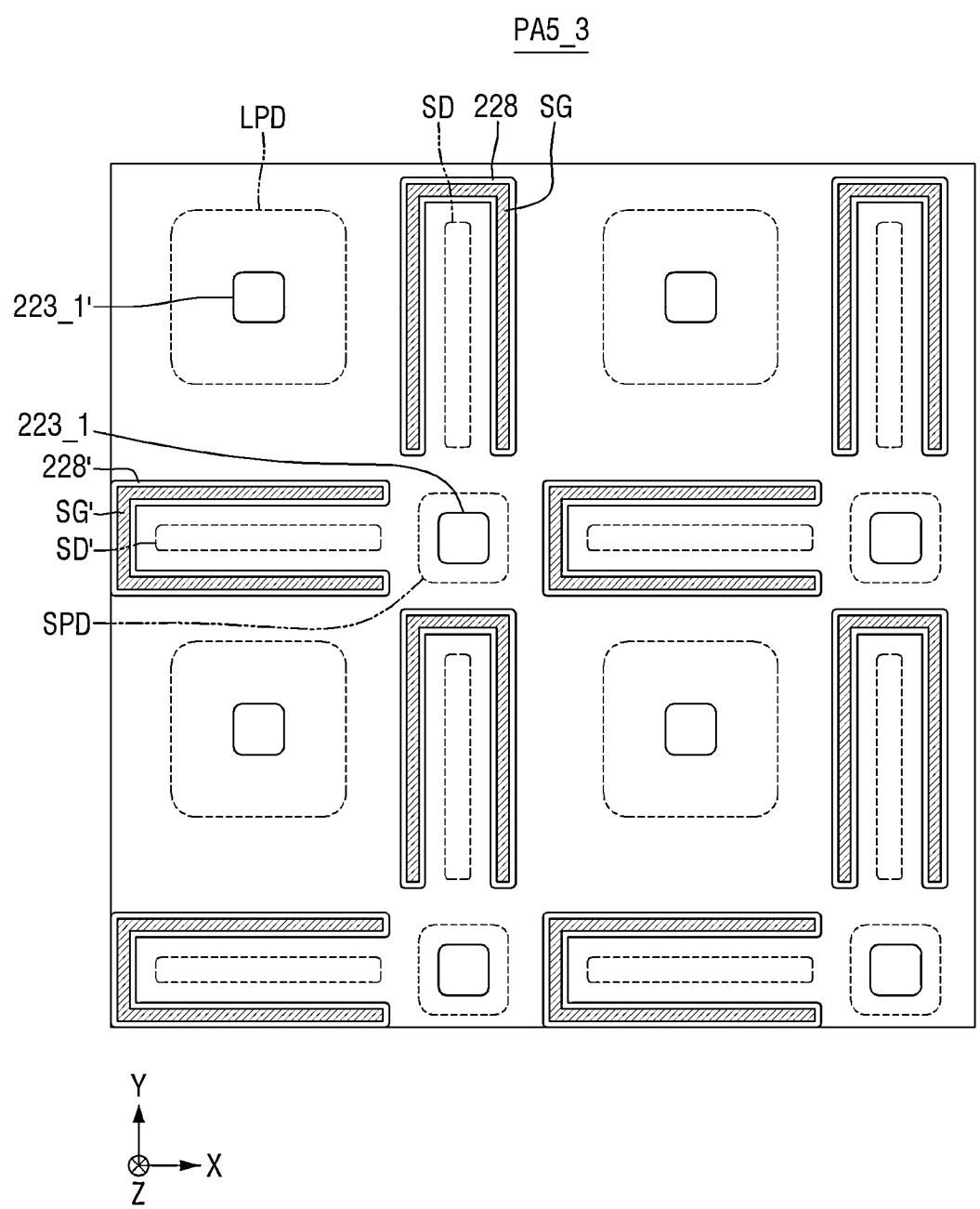

FIGS. 29 and 30 are layout views of pixel array areas according to some embodiments of the present disclosure.

Referring to FIG. 29, a pixel array area PA5_2 may include pixel separation patterns DTI. Each pixel may be defined by the pixel separation patterns DTI, storage gates SG, insulating spacer films 228, and storage diodes SD. That is, the storage gates SG, the insulating spacer films 228, and the storage diodes SD may not only read out electric charge overflowing from second photoelectric conversion layers SPD, but also define each pixel.

Referring to FIG. 30, a pixel array area PA5_3 may include storage gates SG', insulating spacer films 228', and storage diodes SD'. Storage gates SG', insulating spacer films 228', and storage diodes SD' may differ from the storage gates SG, the insulating spacer films 228, and the storage diodes SD, respectively. That is, the storage gates SG, the insulating spacer films 228, and the storage diodes SD may be spaced apart from the second photoelectric conversion layers SPD in a second direction Y, but the storage gates SG', the insulating spacer films 228', and the storage diodes SD' may be spaced apart from the second photoelectric conversion layers SPD in a first direction X. Also, the storage gates SG, the insulating spacer films 228, the storage diodes SD, the storage gates SG', the insulating spacer films 228', and the storage diodes SD' may define and isolate each pixel of the pixel array area PA5_3.

A pixel array area PA of an image sensor according to some embodiments of the present disclosure will hereinafter be described with reference to FIGS. 31 and 32.

Figure 31:
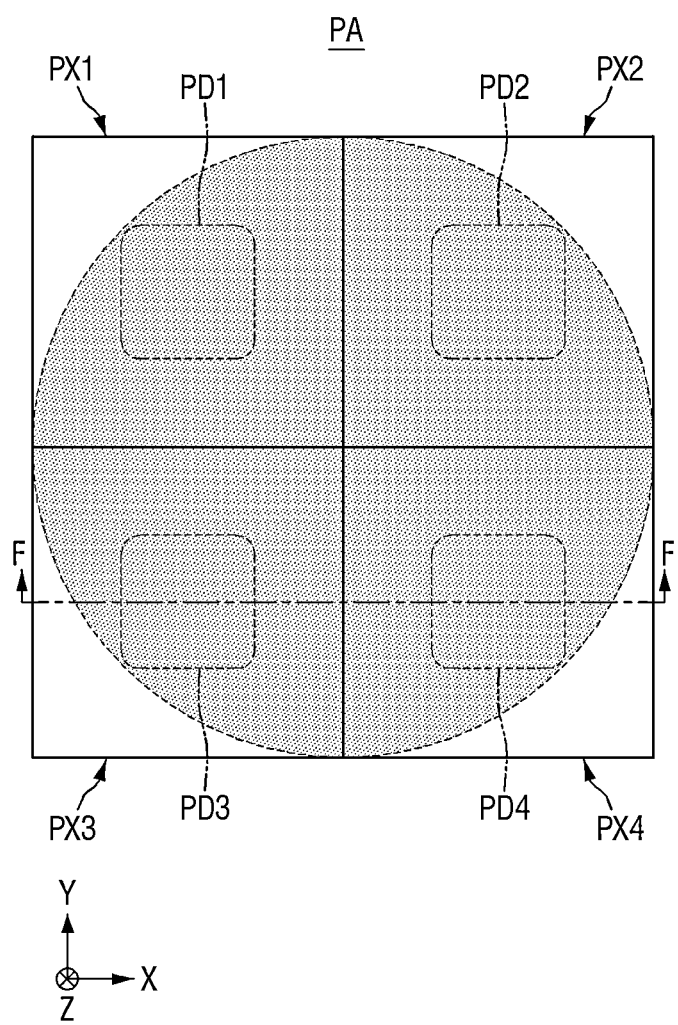
FIG. 31 is a layout view of a pixel array area of an image sensor according to some embodiments of the present disclosure.

FIG. 31 is a layout view of a pixel array area of an image sensor according to some embodiments of the present disclosure. FIG. 32 is a cross-sectional view taken along line F-F of FIG. 31. For convenience, descriptions of elements or features that have already been described above with reference to FIGS. 1 through 30 will be omitted or simplified.

Figure 32:
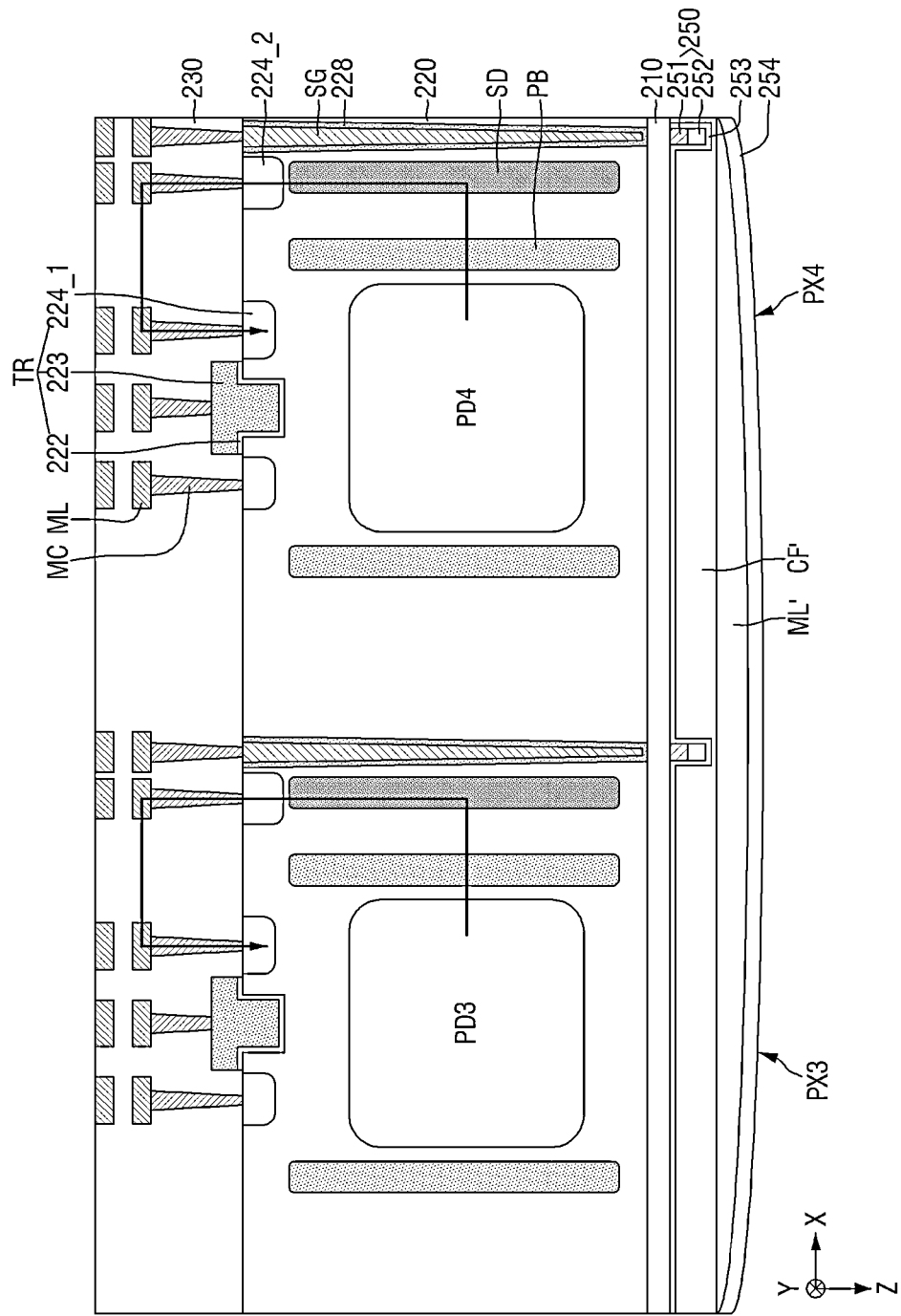
FIG. 32 is a cross-sectional view taken along line F-F of FIG. 31.

Referring to FIGS. 31 and 32, microlenses ML' and color filters CF' may cover a plurality of first, second, third, and fourth pixels PX1, PX2, PX3, and PX4. That is, incident light through the microlenses ML' and the color filters CF' may arrive at first, second, third, and fourth photoelectric conversion layers PD1, PD2, PD3, and PD4 of the first, second, third, and fourth pixels PX1, PX2, PX3, and PX4. Electric charges overflowing from the first, second, third, and fourth photoelectric conversion layers PD1, PD2, PD3, and PD4 may be read out through storage diodes of the first, second, third, and fourth pixels PX1, PX2, PX3, and PX4.

An electronic device 2000 according to some embodiments of the present disclosure will hereinafter be described with reference to FIGS. 33 and 34.

Figure 33:
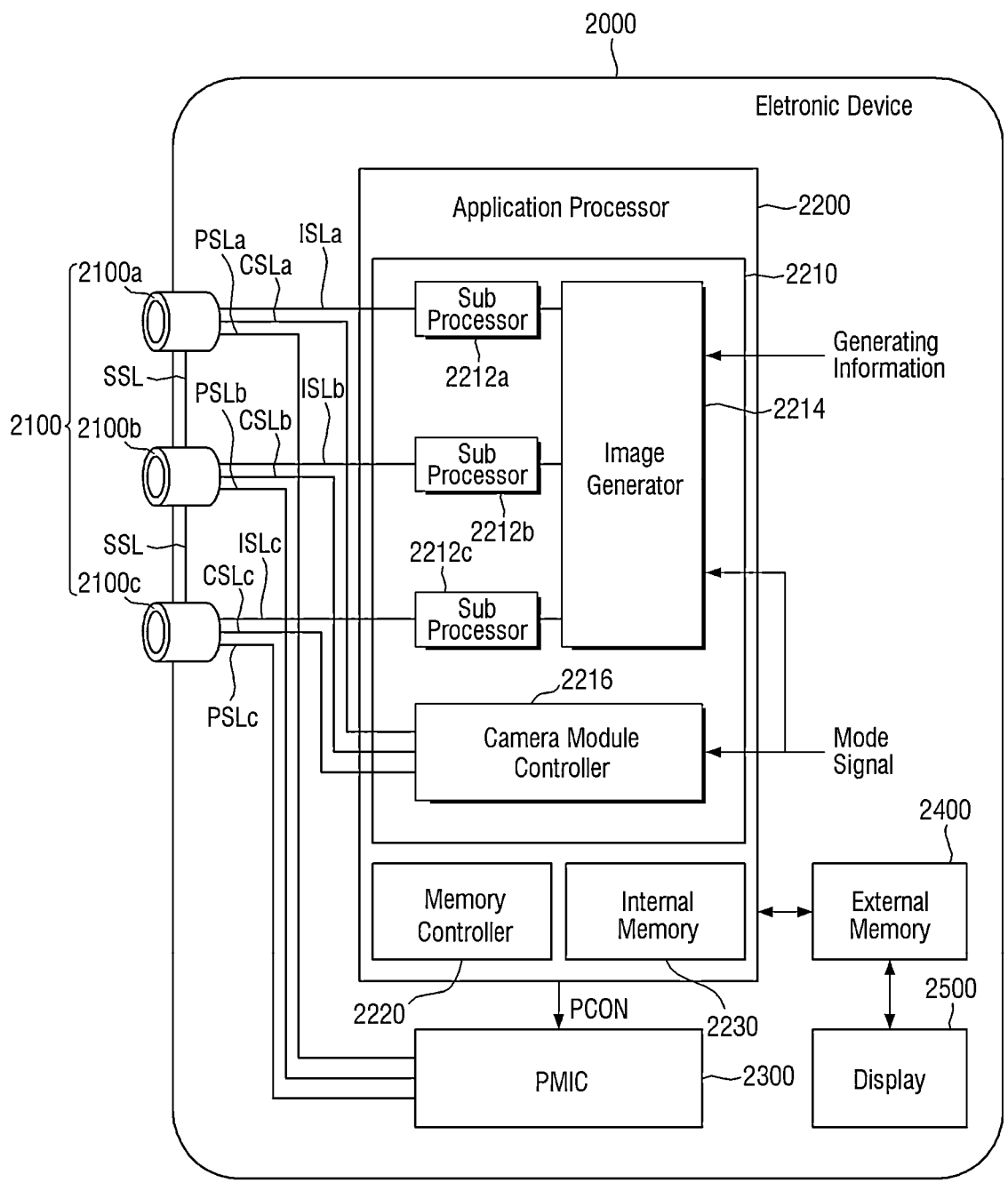
FIG. 33 is a block diagram of an electronic device including a multi-camera module, according to some embodiments of the present disclosure.

FIG. 33 is a block diagram of an electronic device including a multi-camera module, according to some embodiments of the present disclosure. FIG. 34 is a detailed block diagram of the camera module of FIG. 33. For convenience, descriptions of elements or features that have already been described above with reference to FIGS. 1 through 32 will be omitted or simplified.

Referring to FIG. 33, the electronic device 2000 may include a camera module group 2100, an application processor 2200, a power management integrated circuit (PMIC) 2300, an external memory 2400 and a display 2500.

The camera module group 2100 may include a plurality of camera modules 2100a, 2100b, and 2100c. FIG. 33 illustrates that three camera modules are arranged, but the present disclosure is not limited thereto. Alternatively, the camera module group 2100 may be configured to include only two camera modules. Yet alternatively, the camera module group 2100 may be configured to include n camera modules (where n is a natural number of 4 or greater).

One of the camera modules 2100a, 2100b, and 2100c may be a camera module including any one of the image sensors of FIGS. 1 through 32.

The structure of the camera module 2100b will hereinafter be described with reference to FIG. 34. The following description of the camera module 2100b may be directly applicable to the other camera modules 2100a and 2100c.

Figure 34:
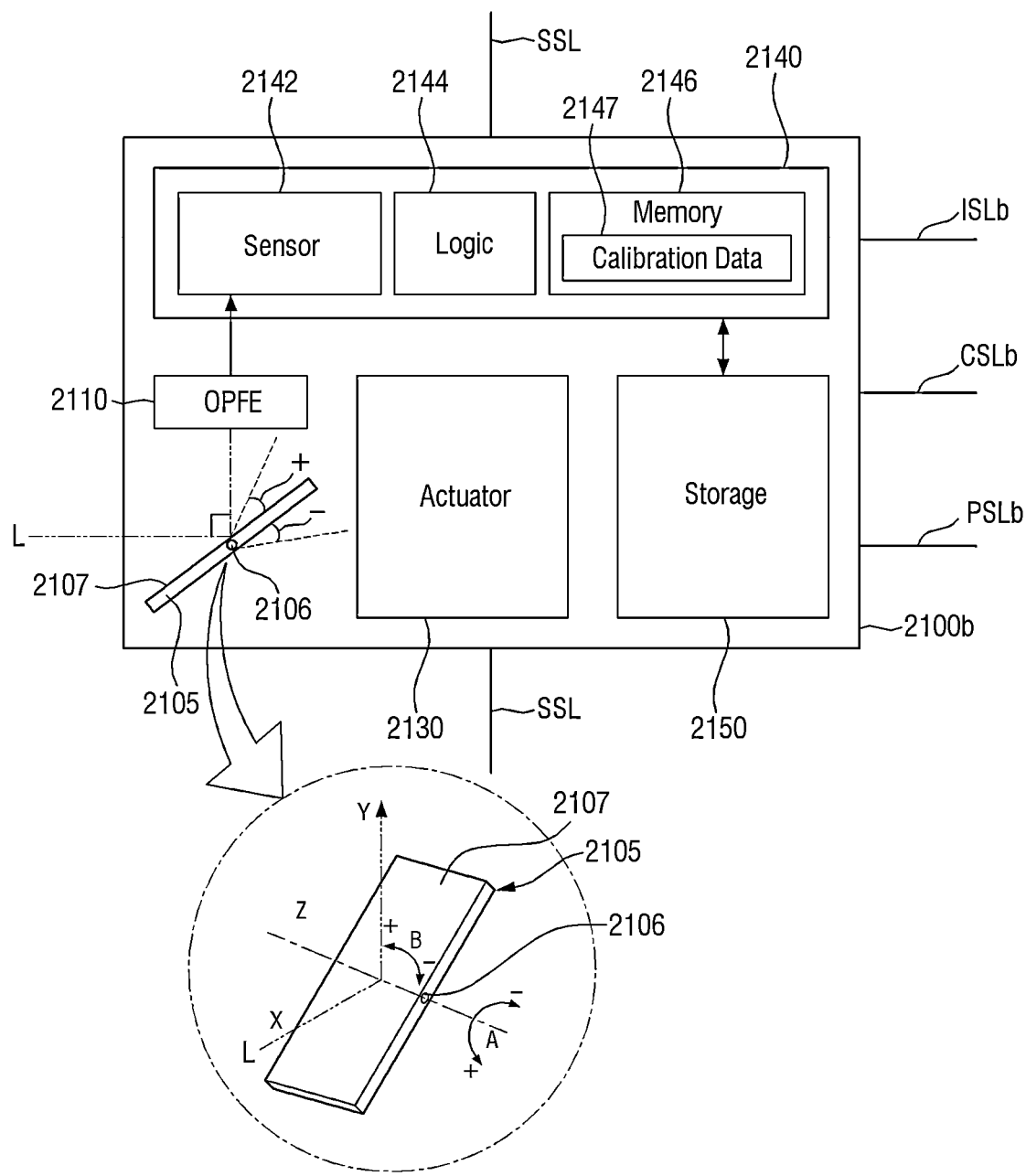
FIG. 34 is a detailed block diagram of the camera module of FIG. 33.

Referring to FIG. 34, the camera module 2100b may include a prism 2105, an optical path folding element (OPFE) 2110, an actuator 2130, an image sensing device 2140 and a storage 2150.

The prism 2105 may include a reflective surface 2107 of a light-reflecting material and may thus change the path of light L incident from the outside.

In some embodiments, the prism 2105 may change the path of the light L from a first direction X to a second direction Y, which is perpendicular to the first direction X. The prim 2105 may change the path of the light L from the first direction X to the second direction Y by rotating the reflective surface 2107 in an A or B direction about a central axis 2106. In this case, the OPFE 2110 may be moved in a third direction Z, which is perpendicular to the first and second directions X and Y.

In some embodiments, the maximum rotation angle of the prism 2105 may be 15 degrees or less in a +A direction and may be greater than 15 degrees in a −A direction, but the present disclosure is not limited thereto.

In some embodiments, the prism 2105 may be moved by about 20 degrees, 10 to 20 degrees, or 15 to 20 degrees in a +B or −B direction. The prism 2105 may be moved by the same angle or similar angles (with a difference of about one degree or less) in both the +B and −B direction.

In some embodiments, the prism 2105 may move the reflective surface 2106 of the light-reflecting material in the third direction Z, which is parallel to the direction in which the central axis 2106 extends.

The OPFE 2110 may include, for example, a group of m optical lenses (where m is a natural number). The m optical lenses may move in the second direction Y to change the optical zoom ratio of the camera module 2100b. For example, when the basic optical zoom ratio of the camera module 2100b is Z, the optical zoom ratio of the camera module 2100b may be changed to 3Z or 5Z or greater by moving the m optical lenses of the OPFE 2110.

The actuator 2130 may move the OPFE 2110 or the optical lenses of the OPFE 2110 to a particular location. For example, the actuator 2130 may adjust the location of the optical lenses of the OPFE 2110 such that an image sensor 2142 can be placed at the focal length of the optical lenses of the OPFE 2110.

The image sensing device 2140 may include the image sensor 2142, a control logic 2144 and a memory 2146. The image sensor 2142 may sense an image of a target object using the light L provided thereto via the optical lenses. In some embodiments, the image sensor 2142 may include an image sensor 100.

The control logic 2144 may control the general operation of the camera module 2100b. For example, the control logic 2144 may control the operation of the camera module 2100b in accordance with a control signal provided thereto via a control signal line CSLb.

The memory 2146 may store information necessary for the operation of the camera module 2100b, such as calibration data 2147. The calibration data 2147 may include information necessary for the camera module 2100b to generate image data based on the light L. The calibration data 2147 may include, for example, degree-of-rotation information, focal length information and optical axis information. In a case where the camera module 2100b is implemented as a multistate camera whose focal length changes depending on the location of optical lengths thereof, the calibration data 2147 may include focal length data for different locations (or states) of optical lenses and auto-focusing information.

The storage 2150 may store image data sensed by the image sensor 2142. The storage 2150 may be disposed on the outside of the image sensing device 2140 and may be stacked on or below a sensor chip of the image sensing device 2140. In some embodiments, the storage 2150 may be implemented as an electrically erasable programmable read-only memory (EEPROM), but the present disclosure is not limited thereto.

Referring to FIGS. 33 and 34, in some embodiments, the camera modules 2100a, 2100b, and 2100c may include their own actuator 2130. Accordingly, the camera modules 2100a, 2100b, and 2100c may include the same or different calibration data 2147 depending on the operation of their own actuator 2130.

In some embodiments, one of the camera modules 2100a, 2100b, and 2100c, for example, the camera module 2100b, may be a folded lens-type camera module including the prism 2105 and the OPFE 2110, and the other camera modules may be vertical camera modules including no prism 2105 and no OPFE 2110. However, the present disclosure is not limited to this.

In some embodiments, one of the camera modules 2100a, 2100b, and 2100c, for example, the camera module 2100c, may be a vertical depth camera capable of extracting depth information using, for example, infrared (IR) rays. In this case, the application processor 2200 may generate a three-dimensional (3D) depth image by merging image data provided by the camera module 2100c and image data provided by the other camera modules, i.e., the camera modules 2100a and 2100b.

In some embodiments, at least two of the camera modules 2100a, 2100b, and 2100c, for example, the camera modules 2100a and 2100c, may have different fields of view. In this case, at least two of the camera modules 2100a, 2100b, and 2100c, for example, the camera modules 2100a and 2100c, may have different sets of optical lenses, but the present disclosure is not limited thereto.

In some embodiments, the camera modules 2100a, 2100b, and 2100c may all have different viewing angles. In this case, the camera modules 2100a, 2100b, and 2100c may all have different sets of optical lenses, but the present disclosure is not limited thereto.

In some embodiments, the camera modules 2100a, 2100b, and 2100c may be physically separated from one another. That is, the camera modules 2100a, 2100b, and 2100c may have their own image sensor 2142 disposed therein, rather than sharing the sensing area of one image sensor 2142.

Referring again to FIG. 33, the application processor 2200 may include an image processor 2210, a memory controller 2220 and an internal memory 2230. The application processor 2200 may be configured to be separate from the camera modules 2100a, 2100b, and 2100c. For example, the application processor 2200 may be implemented as a separate semiconductor chip from the camera modules 2100a, 2100b, and 2100c.

The image processor 2210 may include a plurality of sub-image processors 2212a, 2212b, and 2212c, an image generator 2214 and a camera module controller 2216.

The image processor 2210 may include as many sub-image processors as there are camera modules.

Image data generated by the camera modules 2100a, 2100b, and 2100c may be provided to the sub-image processors 2212a, 2212b, and 2212c via separate image signal lines ISLa, ISLb, and ISLc. For example, the image data generated by the camera module 2100a may be provided to the sub-image processor 2212a via the image signal line ISLa, the image data generated by the camera module 2100b may be provided to the sub-image processor 2212b via the image signal line ISLb, and the image data generated by the camera module 2100c may be provided to the sub-image processor 2212c via the image signal line ISLc. The image data generated by the camera modules 2100a, 2100b, and 2100c may be transmitted via, for example, a mobile industry processor interface (MIPI)-based camera serial interface (CSI), but the present disclosure is not limited thereto.

In some embodiments, one sub-image processor may be disposed to correspond to multiple camera modules. For example, the sub-image processors 2212a and 2212c may be incorporated into a single sub-image processor. In this example, one of image data provided by the camera module 2100a and image data provided by the camera module 2100c may be selected by, for example, a multiplexer, and the selected image data may be provided to the single sub-image processor.

The image data provided to each of the sub-image processors 2212a, 2212b, and 2212c may be provided to the image generator 2214. The image generator 2214 may generate an output image based on the image data provided to each of the sub-image processors 2212a, 2212b, and 2212c, in accordance with image generating information or a mode signal.

Specifically, the image generator 2214 may generate an output image by merging at least some of the image data generated by the camera modules 2100a, 2100b, and 2100c, which have different viewing angles. Also, the image generator 2214 may generate an output image by selecting one of the image data generated by the camera modules 2100a, 2100b, and 2100c, which have different viewing angles, in accordance with the image generating information or the mode signal.

In some embodiments, the image generating information may include a zoom signal (or a zoom factor). In some embodiments, the mode signal may be, for example, a signal of a mode selected by a user.

If the image generating signal is a zoom signal (or a zoom factor) and the camera modules 2100a, 2100b, and 2100c have different fields of view (or different viewing angles), the image generator 2214 may perform different operations depending on the type of the zoom signal. For example, if the zoom signal is a first signal, image data output by the camera module 2100a and image data output by the camera module 2100c may be merged together, and an output image may be generated using the merged image data and image data output by the camera module 2100b. For example, if the zoom signal is a second signal, which is different from the first signal, the image generator 2214 may generate an output image by selecting one of the image data output by the camera modules 2100a, 2100b, and 2100c, instead of merging the image data output by the camera modules 2100a, 2100b, and 2100c. However, the present disclosure is not limited to this. That is, the method to process image data may vary.

In some embodiments, the image generator 2214 may receive multiple image data having different exposure durations from at least one of the sub-image processors 2212a, 2212b, and 2212c and may perform high dynamic range (HDR) processing on the multiple image data, thereby generating merged image data with an increased dynamic range.

The camera module controller 2216 may provide control signals to the camera modules 2100a, 2100b, and 2100c. The control signals may be provided from the camera module controller 2216 to the camera modules 2100a, 2100b, and 2100c via separate control signal lines CSLa, CSLb, and CSLc.

In accordance with the image generating information or the mode signal, one of the camera modules 2100a, 2100b, and 2100c, for example, the camera module 2100a, may be designated as a master camera, and the other camera modules, i.e., the camera modules 2100b, and 2100c, may be designated as slave cameras. This type of information may be included in a control signal and may thus be provided to the camera modules 2100a, 2100b, and 2100c via the control signal lines CSLa, CSLb, and CSLc.

The master camera and the slave cameras may be changed in accordance with a zoom signal (or a zoom factor) or the mode signal. For example, if the camera module 2100a has a wider field of view than the camera module 2100c and the zoom signal denotes a low zoom ratio, the camera module 2100c may operate as a master camera, and the camera module 2100a may operate as a slave camera. On the contrary, if the zoom signal denotes a high zoom ratio, the camera module 2100a may operate as a master camera, and the camera module 2100c may operate as a slave camera.

In some embodiments, the control signals provided from the camera module controller 2216 to the camera modules 2100a, 2100b, and 2100c may include a sync enable signal. For example, if the camera module 2100b is a master camera and the camera modules 2100a and 2100c are slave cameras, the camera module controller 2216 may transmit the sync enable signal to the camera module 2100b. Then, the camera module 2100b may generate a sync signal based on the sync enable signal and may provide the sync signal to the camera modules 2100a and 2100c via sync signal lines SSL. As a result, the camera modules 2100a, 2100b, and 2100c may all be synchronized with the sync signal to transmit image data to the application processor 2200.

In some embodiments, the control signals provided from the camera module controller 2216 to the camera modules 2100a, 2100b, and 2100c may include mode information from the mode signal. The camera modules 2100a, 2100b, and 2100c may operate in first and second operating modes, which are associated with a sensing speed, based on the mode information.

In the first operating mode, the camera modules 2100a, 2100b, and 2100c may generate an image signal at a first speed (e.g., at a first frame rate), may encode the image signal at a second speed higher than the first speed (e.g., at a second frame rate higher than the first frame rate) and may transmit the encoded image signal to the application processor 2200. The second speed may be 30 times or less the first speed.

The application processor 2200 may store a received image signal, i.e., an encoded image signal, in the internal memory 2230 or in the external memory 2400, which is outside the application processor 2200, may read out and decode the encoded image signal from the internal or external memory 2230 or 2400 and may display image data generated based on the decoded image signal. For example, one of the sub-processors 2212a, 2212b, and 2212c of the image processor 2210 may decode the encoded image signal and may perform image processing on the decoded image signal. For example, the image data generated based on the decoded image signal may be displayed by the display 2500.

In the second operating mode, the camera modules 2100a, 2100b, and 2100c may generate an image signal at a third speed lower than the first speed (e.g., at a third frame rate lower than the first frame rate) and may transmit the encoded image signal to the application processor 2200. The image signal provided to the application processor 2200 may be an unencoded signal. The application processor 2200 may perform image processing on the image signal provided thereto or may store the image signal provided thereto in the internal or external memory 2230 or 2400.

The PMIC 2300 may provide power, for example, power supply voltages, to the camera modules 2100a, 2100b, and 2100c. For example, the PMIC 2300 may provide first power to the camera module 2100a via a power signal line PSLa, second power to the camera module 2100b via a power signal line PSLb and third power to the camera module 2100c via a power signal line PSLc under the control of the application processor 2200.

The PMIC 2300 may generate power for each of the camera modules 2100a, 2100b, and 2100c in response to a power control signal PCON from the application processor 2200 and may control the level of the power. The power control signal PCON may include a power control signal for different operating modes of the camera modules 2100a, 2100b, and 2100c. For example, the different operating modes may include a lower power mode, and the power control signal PCON may include information indicating which of the camera modules 2100a, 2100b, and 2100c is to operate in the lower power mode and information indicating the level of power at which the camera module that is to operate in the lower power mode is to be set. The first power, the second power and the third power provided to the camera modules 2100a, 2100b, and 2100c, respectively, may have the same level or different levels. Also, the level of the first power, the second power and the third power provided to the camera modules 2100a, 2100b, and 2100c, respectively, may be dynamically controllable.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

Embodiments of the present disclosure have been described above with reference to the accompanying drawings, but the present disclosure is not limited thereto and may be implemented in various different forms. It will be understood that the present disclosure can be implemented in other specific forms without changing the technical spirit or gist of the present disclosure. Therefore, it should be understood that the embodiments set forth herein are illustrative in all respects and not limiting.

What is claimed is:

1. An image sensor comprising:
    a substrate including a first surface and a second surface, which is opposite to the first surface and upon which light is incident;
    a photoelectric conversion layer in the substrate;
    an isolation film disposed on the substrate, along the photoelectric conversion layer;
    a storage conductive pattern disposed in the isolation film;
    a transfer gate disposed on a first surface of the substrate;
    a storage diode disposed between the photoelectric conversion layer and the storage conductive pattern in a first direction parallel to the first surface;
    a first impurity-injected area disposed between the storage diode and the first surface in a second direction perpendicular to the first direction; and
    a second impurity-injected area disposed on the first surface of the substrate and directly connected to the transfer gate, wherein
    the first and second impurity-injected areas are electrically connected.

2. The image sensor of claim 1, further comprising an impurity-injected barrier area disposed in the substrate between the photoelectric conversion layer and the storage conductive pattern in the first direction.

3. The image sensor of claim 2, wherein an impurity type of the photoelectric conversion layer and the first impurity-injected area differs from an impurity type of the impurity-injected barrier area.

4. The image sensor of claim 1, wherein the isolation film and the storage conductive pattern extend from the first surface to the second surface and thereby penetrate the substrate.

5. The image sensor of claim 1, wherein a voltage is applied to the storage conductive pattern.

6. The image sensor of claim 1, further comprising:
    a separation pattern disposed in the substrate between the photoelectric conversion layer and the first impurity-injected area, wherein
    the separation pattern extends from the first surface and is exposed at the first surface, but not at the second surface.

7. The image sensor of claim 6, wherein the separation pattern is not disposed between part of the photoelectric conversion layer adjacent to the second surface and part of the first impurity-injected area adjacent to the second surface.

8. The image sensor of claim 1, further comprising:
    a separation pattern disposed in the substrate between the photoelectric conversion layer and the first impurity-injected area, wherein
    the separation pattern extends from the second surface and is exposed at the second surface, but not at the first surface.

9. The image sensor of claim 8, wherein the separation pattern is not disposed between part of the photoelectric conversion layer adjacent to the first surface and part of the first impurity-injected area adjacent to the first surface.

10. The image sensor of claim 1, wherein the isolation film is disposed to surround part of the first impurity-injected area and is spaced apart from the photoelectric conversion layer.

11. The image sensor of claim 10, wherein the isolation film extends from the first surface to the second surface and thereby penetrates the substrate.

12. An image sensing circuit comprising:
    a pixel generating an image signal; and
    a read-out circuit connected to the pixel, wherein:
    the pixel includes:
        a photoelectric conversion layer configured to convert incident light into first and second electric charges that are different from each other, and
        a capacitor configured to receive the second electric charge from the photoelectric conversion layer and store the second electric charge, and the read-out circuit includes:
        a transfer transistor which is disposed adjacent to the photoelectric conversion layer and configured to receive the first electric charge from the photoelectric conversion layer,
        a floating diffusion which is connected to the transfer transistor and the capacitor and configured to receive the first and second electric charges,
        the first electric charge passes through the transfer transistor as it flows from the photoelectric conversion layer to the floating diffusion and the second electric charge does not pass through the transfer transistor as it flows from the photoelectric conversion layer to the floating diffusion.

13. The image sensing circuit of claim 12, wherein the read-out circuit includes an auxiliary capacitor which is connected to the floating diffusion and configured to store the first electric charge received from the transfer transistor.

14. The image sensing circuit of claim 12, wherein the pixel stores the second electric charge by applying a voltage to the capacitor or transmits the second electric charge to the read-out circuit.

15. The image sensing circuit of claim 12, wherein the second electric charge includes electric charge overflow from the photoelectric conversion layer.

16. An image sensor comprising:
    a substrate including a first surface and a second surface, which is opposite to the first surface and upon which light is incident;
    a photoelectric conversion layer in the substrate;
    a capacitor in the substrate, the capacitor extending in a first direction, which is perpendicular to the first surface, along the photoelectric conversion layer;
    a transfer gate disposed on the first surface of the substrate;
    a first impurity-injected area disposed on the first surface of the substrate and connected to the transfer gate; and
    a connecting structure disposed on the first surface of the substrate, wherein:

the capacitor and the first impurity-injected area are connected by the connecting structure, and an electric charge received by the capacitor from the photoelectric conversion layer is transferred by the capacitor to the first impurity-injected area without passing through the transfer gate.

17. The image sensor of claim 16, wherein the capacitor is spaced apart from the photoelectric conversion layer in a second direction, which is perpendicular to the first direction, and extends in a third direction, which intersects the first and second directions.

18. The image sensor of claim 16, wherein part of the capacitor is exposed at the first and second surfaces of the substrate.

19. The image sensor of claim 16, further comprising:
an impurity-injected barrier area disposed in the substrate between the photoelectric conversion layer and the capacitor in a second direction that is perpendicular to the first direction, wherein an impurity type of the photoelectric conversion layer differs from an impurity type of the impurity-injected barrier area.

20. The image sensor of claim 19, wherein the impurity-injected barrier area extends in the first direction along the photoelectric conversion layer.

* * * * *